United States Patent
Kume et al.

(10) Patent No.: US 9,989,854 B2
(45) Date of Patent: Jun. 5, 2018

(54) PHOTOSENSITIVE RESIN COMPOSITION FOR PROJECTION EXPOSURE, PHOTOSENSITIVE ELEMENT, METHOD FOR FORMING RESIST PATTERN, PROCESS FOR PRODUCING PRINTED WIRING BOARD AND PROCESS FOR PRODUCING LEAD FRAME

(71) Applicant: HITACHI CHEMICAL COMPANY, LTD., Tokyo (JP)

(72) Inventors: Masakazu Kume, Tokyo (JP); Momoko Munakata, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 221 days.

(21) Appl. No.: 14/906,595

(22) PCT Filed: Jul. 22, 2014

(86) PCT No.: PCT/JP2014/069353
§ 371 (c)(1),
(2) Date: Jan. 21, 2016

(87) PCT Pub. No.: WO2015/012272
PCT Pub. Date: Jan. 29, 2015

(65) Prior Publication Data
US 2016/0170299 A1 Jun. 16, 2016

(30) Foreign Application Priority Data

Jul. 23, 2013 (JP) .................................. 2013-152563

(51) Int. Cl.
*G03F 7/04* (2006.01)
*G03F 7/40* (2006.01)
(Continued)

(52) U.S. Cl.
CPC ............ *G03F 7/11* (2013.01); *C23C 18/1605* (2013.01); *C23C 18/1633* (2013.01);
(Continued)

(58) Field of Classification Search
CPC ... G03F 7/004; G03F 7/11; G03F 7/38; G03F 7/40; H01L 21/0274; H01L 21/0332; H01L 21/0337
(Continued)

(56) References Cited

U.S. PATENT DOCUMENTS 8,501,392 B2 * 8/2013 Saitou ....................... G03F 7/11
430/270.1
8,592,130 B2 * 11/2013 Miyasaka ................. C08F 2/50
430/270.1

FOREIGN PATENT DOCUMENTS

JP 2006-151959 A 6/2006
JP 2007-017814 A 1/2007
(Continued)

OTHER PUBLICATIONS

Machine translation of JP 2012-048202 (no date).*
(Continued)

*Primary Examiner* — Amanda C Walke
(74) *Attorney, Agent, or Firm* — Fitch, Even, Tabin & Flannery, LLP

(57) ABSTRACT

An object of the present invention is to provide a photosensitive resin composition for projection exposure capable of forming a resist pattern that is excellent in adhesion, resolution, and inhibitory properties against the occurrence of resist footing, and the present invention provides a photosensitive resin composition for projection exposure comprising (A) a binder polymer; (B) a photopolymerizable compound having an ethylenically unsaturated bond; (C) a
(Continued)

photopolymerization initiator; and (D) a sensitizing dye, wherein the (B) photopolymerizable compound having an ethylenically unsaturated bond comprises a (meth)acrylate compound having a skeleton derived from dipentaerythritol and a compound represented by the following formula (III):

[Chemical Formula 1]

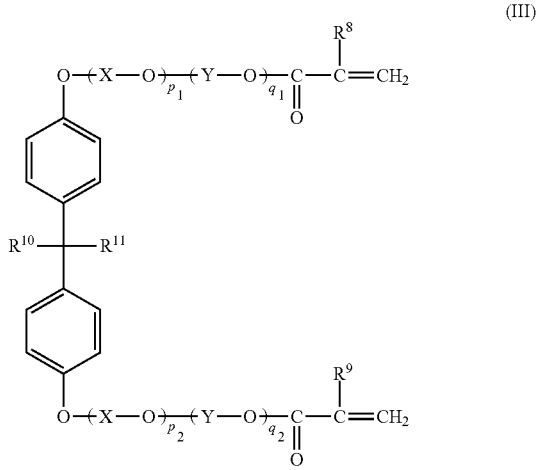

(III)

wherein $R^8$, $R^9$, $R^{10}$, and $R^{11}$ each independently represent a hydrogen atom or a methyl group, X and Y each independently represent an ethylene group or a propylene group, $p_1$, $p_2$, $q_1$, and $q_2$ each independently represent a numerical value of 0 to 9, both $p_1+q_1$ and $p_2+q_2$ are 1 or more, and $p_1+q_1+p_2+q_2$ is 2 to 9.

16 Claims, 5 Drawing Sheets

(51) Int. Cl.
| | | |
|---|---|---|
| G03F 7/11 | (2006.01) | |
| H01L 21/027 | (2006.01) | |
| G03F 7/38 | (2006.01) | |
| H01L 21/033 | (2006.01) | |
| G03F 7/027 | (2006.01) | |
| H05K 3/10 | (2006.01) | |
| G03F 7/033 | (2006.01) | |
| C23C 18/16 | (2006.01) | |
| G03F 7/031 | (2006.01) | |
| G03F 7/20 | (2006.01) | |
| G03F 7/32 | (2006.01) |

(52) U.S. Cl.
CPC .............. *G03F 7/027* (2013.01); *G03F 7/031* (2013.01); *G03F 7/033* (2013.01); *G03F 7/20* (2013.01); *G03F 7/32* (2013.01); *G03F 7/38* (2013.01); *G03F 7/40* (2013.01); *H01L 21/0274* (2013.01); *H01L 21/0332* (2013.01); *H01L 21/0337* (2013.01); *H05K 3/108* (2013.01)

(58) Field of Classification Search
USPC ......... 430/270.1, 271.1, 322, 325, 329, 330, 430/331
See application file for complete search history.

(56) References Cited

FOREIGN PATENT DOCUMENTS

| | | | |
|---|---|---|---|
| JP | 2007-071914 A | | 3/2007 |
| JP | 2008094803 A | * | 4/2008 |
| JP | 2009-003369 A | | 1/2009 |
| JP | 2009-139616 A | | 6/2009 |
| JP | 2009-210698 A | | 9/2009 |
| JP | 2009-258471 A | | 11/2009 |
| JP | 2012-048202 A | | 3/2012 |
| JP | 2012048202 A | * | 3/2012 |
| JP | 2012-094586 A | | 5/2012 |
| JP | 2013-092693 A | | 5/2013 |
| JP | 2014-081440 A | | 5/2014 |
| TW | 201214041 A | | 4/2012 |
| WO | 2008/062707 A1 | | 5/2008 |
| WO | 2009/038082 A1 | | 3/2009 |
| WO | 2009/078380 A1 | | 6/2009 |

OTHER PUBLICATIONS

Machine translation of JP 2008-094803 (no date).*
Machine translation of JP 2004-184878 (no date).*
International Preliminary Report on Patentability in counterpart WO Patent Appln. PCT/JP2014/069353 dated Feb. 4, 2016 in English.
International Search Report for PCT/JP2014/069353 dated Sep. 9, 2014; English translation submitted herewith (6 Pages).
Office Action of counterpart TW Patent Application No. 103125084 dated May 31, 2017.

* cited by examiner (a)

(b)

(c)

(d)

(e)

(f)

PHOTOSENSITIVE RESIN COMPOSITION FOR PROJECTION EXPOSURE, PHOTOSENSITIVE ELEMENT, METHOD FOR FORMING RESIST PATTERN, PROCESS FOR PRODUCING PRINTED WIRING BOARD AND PROCESS FOR PRODUCING LEAD FRAME

TECHNICAL FIELD

The present invention relates to a photosensitive resin composition for projection exposure, a photosensitive element, a method for forming a resist pattern, a process for producing a printed wiring board, and a process for producing a lead frame.

BACKGROUND ART

Conventionally, in the field of production of printed wiring boards, photosensitive resin compositions and photosensitive elements (laminated products) having a structure in which a layer formed using the photosensitive resin composition (hereinafter, referred to as "photosensitive resin layer"), is laminated on a support, and a protective layer is disposed on the photosensitive resin layer are widely used as resist materials to be used for etching, plating, or the like.

A printed wiring board is produced using such a photosensitive element, for example, by the following procedure. That is, the photosensitive resin layer of the photosensitive element is first laminated on a circuit-forming board such as a copper-clad laminate. At this time, the lamination is performed so that a surface of the photosensitive resin layer (hereinafter, referred to as "upper surface" of the photosensitive resin layer) opposite to a surface thereof (hereinafter, referred to as "lower surface" of the photosensitive resin layer) that is in contact with the support is in close contact with a surface of the circuit-forming board that forms a circuit. Therefore, in the case where a protective layer is disposed on the upper surface of the photosensitive resin layer, the laminating operation is performed while the protective layer is being peeled off. Further, the lamination is performed by thermocompression bonding of the photosensitive resin layer to the circuit-forming board that is a base (lamination under atmospheric pressure).

Next, the photosensitive resin layer is subjected to pattern exposure through a mask film, or the like. At this time, the support is stripped away at a timing, either before exposure or after exposure. Thereafter, the unexposed portions of the photosensitive resin layer are removed by dissolution or dispersion in a developer. Next, a pattern is formed by etching or plating, and the cured portions of the photosensitive resin layer are finally stripped away to be removed.

Meanwhile, as a technique for the aforementioned pattern exposure, a projection exposure method in which the photosensitive resin layer is exposed to light by irradiation via a lens with active light projecting a photomask image has been used in recent years. As a light source to be used in the projection exposure method, an ultrahigh pressure mercury lamp is used. Generally, exposure machines using the i-line monochromatic light (365 nm) as an exposure wavelength are mostly used, but the exposure wavelengths of the h-line monochromatic light (405 nm) and ihg mixed lines may be used in some cases.

The projection exposure method is an exposure method that can ensure high resolution and high alignment as compared to a contact exposure method. Therefore, much attention has been given to the projection exposure method in recent years in which circuit formation in printed wiring boards is required to be refined.

On the other hand, since the projection exposure method generally uses monochromatic light in order to obtain high resolution, the amount of irradiation energy tends to be low, and the exposure time tends to be long, as compared with ihg exposure machines or contact exposure machines. Further, whereas the contact exposure method employs one-shot exposure, the projection exposure method employs fractionated exposure, and therefore the total exposure time thereof tends to be further longer. Accordingly, the illuminance is designed to be higher in projection exposure machines than in contact exposure machines, and one exposure time in the projection exposure machines tends to be shorter than in the contact exposure machines.

With development of such a projection exposure method, a photosensitive resin composition capable of forming a resist pattern having fine line adhesion even with a short exposure time has been studied (for example, see Patent Literature 1).

CITATION LIST

Patent Literature

Patent Literature 1: International Publication No. WO 2009/078380

SUMMARY OF INVENTION

Technical Problem

As resist patterns have been further refined in recent years, even in the case of forming patterns with L/S (line width/space width)=10/10 (unit: μm) or less, particularly, in the plating process, the patterns are required to have high adhesion.

In order to improve the adhesion, it is effective to improve the hydrophobicity, the crosslink density, and the followability to projections and recesses on the substrate of the photosensitive resin layer. Here, examples of the method for improving the hydrophobicity of the photosensitive resin layer include a method using a photopolymerizable compound having a hydrophobic action. However, the photopolymerizable compound having a hydrophobic action forms a rigid network after a photoreaction, and therefore, a large amount of addition thereof may reduce the flexibility of a cured product of the photosensitive resin layer, rather reducing the adhesion of the cured product, in some cases. Therefore, in order to further improve the adhesion, the crosslink density of the photosensitive resin layer needs to be improved.

Further, in the photosensitive resin layer for forming a resist pattern, the residue of the resist bottom (resist footing) also needs to be reduced. The residue of the resist bottom (resist footing) occurs due to the resist bottom swelling and expanding in the development step, thus failing to be stripped away from the substrate even by drying. High occurrence of resist footing reduces the contact area between plating and the substrate, thereby causing a reduction in mechanical strength of the formed circuit. The influence of resist footing increases as the circuit formation of printed wiring boards is refined, and particularly in the case of forming a circuit with L/S of 10/10 (unit: μm) or less, high occurrence of resist footing may make it difficult to form the circuit itself after plating. Therefore, there is a demand for a photosensitive resin composition capable of forming a resist pattern with lower occurrence of resist footing.

In order to reduce the occurrence of resist footing, the crosslink density and the hydrophobicity of the photosensitive resin layer need to be improved, but a large amount of addition of a photopolymerizable compound having a hydrophobic action may rather reduce the adhesion in some cases, as described above, and therefore the crosslink density of the photosensitive resin layer needs to be improved for further improving the adhesion.

Photosensitive resin compositions having improved curability of the resist bottom have been widely developed for the contact exposure method that has been conventionally used. However, it is known that, in the case of using the above projection exposure machine with a photosensitive resin composition for the conventional contact exposure method, one exposure time is short, therefore resulting in insufficient curing at the bottom of the photosensitive resin composition, a failure to obtain a crosslink density enough to reduce the occurrence of resist footing, and an increase in the occurrence of resist footing.

Therefore, there is a demand for developing a photosensitive resin composition that has high adhesion and allows a crosslink density enough to reduce the occurrence of resist footing to be obtained in the projection exposure method.

The present invention has been devised in view of the problems of the conventional arts described above, and an object thereof is to provide a photosensitive resin composition for projection exposure capable of forming a resist pattern that is excellent in adhesion, resolution, and inhibitory properties against the occurrence of resist footing in the projection exposure method, a photosensitive element, a method for forming a resist pattern, a process for producing a printed wiring board, and a process for producing a lead frame using the resin composition.

Solution to Problem

In order to achieve the above object, the present invention provides a photosensitive resin composition for projection exposure comprising: (A) a binder polymer, (B) a photopolymerizable compound having an ethylenically unsaturated bond; (C) a photopolymerization initiator; and (D) a sensitizing dye, wherein the (B) photopolymerizable compound having an ethylenically unsaturated bond comprises a (meth)acrylate compound having a skeleton derived from dipentaerythritol and a compound represented by the following formula (III):

[Chemical Formula 1]

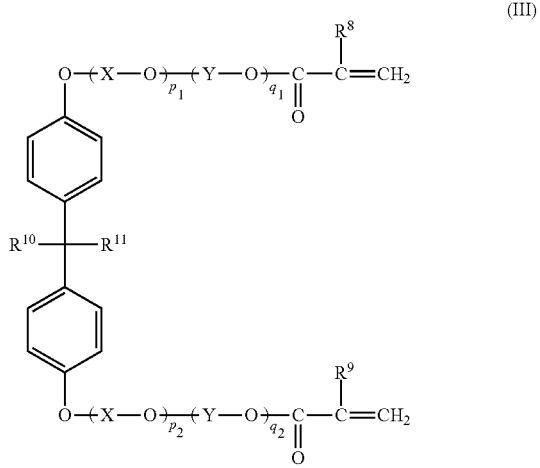

wherein $R^8$, $R^9$, $R^{10}$, and $R^{11}$ each independently represent a hydrogen atom or a methyl group, X and Y each independently represent an ethylene group or a propylene group, $p_1$, $p_2$, $q_1$, and $q_2$ each independently represent a numerical value of 0 to 9, both $p_1+q_1$ and $p_2+q_2$ are 1 or more, and $p_1+q_1+p_2+q_2$ is 2 to 9.

The photosensitive resin composition for projection exposure of the present invention can form, due to having the above configuration, a resist pattern having excellent curability at the resist bottom, reduced occurrence of resist footing, high fine line adhesion, and high resolution in the projection exposure method. It is inferred that the crosslink density in the exposure by the projection exposure method can be improved particularly by using the (meth)acrylate compound having a skeleton derived from dipentaerythritol and the compound represented by the above formula (III) in combination as the (B) photopolymerizable compound having an ethylenically unsaturated bond, so that excellent curability at the resist bottom can be obtained, and a reduction in occurrence of resist footing, an improvement in fine line adhesion, and an improvement in resolution can be achieved. Further, the numerical value of $p_1+q_1+p_2+q_2$ in the above formula (III) is as low as 2 to 9, which contributes to an improvement in crosslink density. Further, the compound represented by the above formula (III) is also a photopolymerizable compound having a hydrophobic action, which contributes to an improvement in adhesion also by enhancing the hydrophobicity of the photosensitive resin composition.

Further, in the photosensitive resin composition for projection exposure of the present invention, it is preferable that the (meth)acrylate compound having a skeleton derived from dipentaerythritol have an ethylene oxide chain. Thereby, a photosensitive resin composition for projection exposure capable of forming a resist pattern that is more excellent in adhesion, resolution, and inhibitory properties against the occurrence of resist footing can be provided.

The present invention also provides a method for forming a resist pattern, comprising: a photosensitive resin layer forming step of forming a photosensitive resin layer on a substrate using the photosensitive resin composition for projection exposure of the present invention described above; an exposure step of exposing at least a part of the photosensitive resin layer to active light projecting an image of a photomask via a lens to photocure the exposed portion; and a development step of removing an uncured portion of the photosensitive resin layer from the substrate by development. According to the method for forming a resist pattern, the photosensitive resin layer is formed using the photosensitive resin composition for projection exposure of the present invention described above, and therefore a resist pattern that is excellent in adhesion, resolution, and inhibitory properties against the occurrence of resist footing can be formed.

The present invention also provides a photosensitive element, comprising: a support; and a photosensitive resin layer formed on the support using the photosensitive resin composition for projection exposure of the present invention described above. According to the photosensitive element, the photosensitive resin layer is formed using the photosensitive resin composition for projection exposure of the present invention described above, and therefore a resist pattern that is excellent in adhesion, resolution, and inhibitory properties against the occurrence of resist footing can be formed.

The present invention also provides a process for producing a printed wiring board, comprising: a step of forming a conductor pattern by etching or plating a substrate on which a resist pattern is formed by the method for forming a resist pattern of the present invention described above. According to the process for producing a printed wiring board, a resist pattern that is excellent in adhesion, resolution, and inhibitory properties against the occurrence of resist footing can be formed by the method for forming a resist pattern of the present invention described above, and therefore a production method suitable for densifying the printed wiring board can be provided.

The present invention further provides a process for producing a lead frame, comprising: a step of forming a conductor pattern by plating a substrate on which a resist pattern is formed by the method for forming a resist pattern of the present invention described above. According to the process for producing a lead frame, a resist pattern that is excellent in adhesion, resolution, and inhibitory properties against the occurrence of resist footing can be formed by the method for forming a resist pattern of the present invention described above, and therefore a production method suitable for densifying the lead frame can be provided.

Advantageous Effect of Invention

The present invention can provide a photosensitive resin composition for projection exposure capable of forming a resist pattern that is excellent in adhesion, resolution, and inhibitory properties against the occurrence of resist footing in the projection exposure method, a photosensitive element, a method for forming a resist pattern, a process for producing a printed wiring board, and a process for producing a lead frame using this composition.

DESCRIPTION OF EMBODIMENTS

Figure 1:
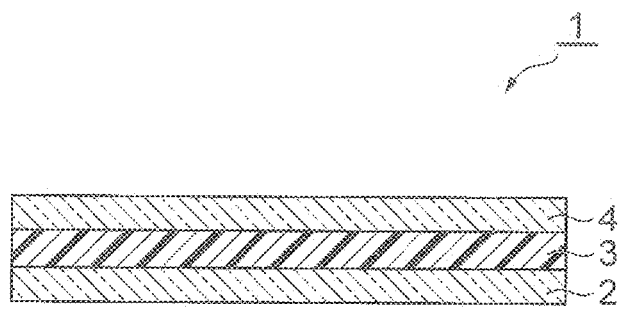
FIG. 1 is a schematic sectional view showing an embodiment of a photosensitive element of the present invention.

Hereinafter, preferable embodiments of the present invention will be described in detail with reference to figures. In this description, a (meth)acrylic acid means at least one of acrylic acids and corresponding methacrylic acids, a (meth)acrylate means at least one of acrylates and corresponding methacrylates, and a (meth)acryloyl group means at least one of acryloyl groups and corresponding methacryloyl groups.

Further, in this description, the term "step" includes not only an independent step, but also a step that cannot be distinctly distinguished from another step, as long as the expected action of the step is achieved.

Further, in this description, a numerical range that is expressed using "to" means a range including the numerical values described before and after the "to", respectively, as the minimum value and the maximum value.

Further, in this description, the term "layer" includes a structure with a shape that is formed on a part of a surface, in addition to a structure with a shape that is formed on the entire surface, as observed in plan view.

<Photosensitive Resin Composition for Projection Exposure>

The photosensitive resin composition for projection exposure according to this embodiment relates to a photosensitive resin composition for projection exposure containing (A) a binder polymer, (B) a photopolymerizable compound having an ethylenically unsaturated bond, (C) a photopolymerization initiator, and (D) a sensitizing dye, wherein the (B) photopolymerizable compound having an ethylenically unsaturated bond contains a (meth)acrylate compound having a skeleton derived from dipentaerythritol and a compound represented by formula (III). Hereinafter, each component used in the photosensitive resin composition for projection exposure according to this embodiment will be described in detail.

[(A) Binder Polymer]

Examples of the (A) binder polymer (hereinafter, referred to also as "(A) component") that can be used in the photosensitive resin composition for projection exposure according to this embodiment include acrylic resins, styrene resins, epoxy resins, amide resins, amide epoxy resins, alkyd resins, and phenol resins. In view of alkali developability, acrylic resins are preferable. One of these can be used alone, or two or more of these can be used in combination.

The (A) binder polymer can be produced, for example, by radical polymerization of a polymerizable monomer. Examples of the polymerizable monomer include styrene, polymerizable styrene derivatives substituted at the α-position or on the aromatic ring such as vinyltoluene, and α-methylstyrene, acrylamide such as diacetoneacrylamide, acrylonitrile, ethers of vinyl alcohol such as vinyl-n-butyl ether, (meth)acrylic acid alkyl ester, (meth)acrylic acid benzyl ester, phenoxyethyl (meth)acrylate, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl (meth)acrylate, 2,2,3,3-tetrafluoropropyl (meth)acrylate, (meth)acrylic acid, α-bromoacrylic acid, α-chloroacrylic acid, β-furyl (meth)acrylic acid, β-styryl (meth)acrylic acid, maleic acid, maleic acid anhydride, maleic acid monoesters such as monomethyl maleate, monoethyl maleate, and monoisopropyl maleate, fumaric acid, cinnamic acid, α-cyanocinnamic acid, itaconic acid, crotonic acid, and propiolic acid. One of these can be used alone, or two or more of these can be used in combination. Among these, it is preferable that phenoxyethyl (meth)acrylate be contained as the polymerizable monomer, and it is more preferable that phenoxyethyl methacrylate be contained as the polymerizable monomer, in order to further improve the developability. Further, it is preferable that (meth)acrylic acid benzyl ester be contained as the polymerizable monomer, in order to further improve the adhesion.

Examples of the (meth)acrylic acid alkyl ester include a compound represented by the following formula (I), and a compound in which the alkyl group of the compound represented by the following formula (I) is substituted with a hydroxyl group, an epoxy group, a halogen group, or the like.

$$H_2C=C(R^6)-COOR^7 \qquad (I)$$

In the formula (I), $R^6$ represents a hydrogen atom or a methyl group, and $R^7$ represents an alkyl group having 1 to 12 carbon atoms.

Examples of the alkyl group having 1 to 12 carbon atoms represented by $R^7$ in the above formula (I) include a methyl group, an ethyl group, a propyl group, a butyl group, a pentyl group, a hexyl group, a heptyl group, an octyl group, a nonyl group, a decyl group, an undecyl group, a dodecyl group, and structural isomers thereof.

Examples of the (meth)acrylic acid alkyl ester represented by the above formula (I) include (meth)acrylic acid methyl ester, (meth)acrylic acid ethyl ester, (meth)acrylic acid propyl ester, (meth)acrylic acid butyl ester, (meth)acrylic acid pentyl ester, (meth)acrylic acid hexyl ester, (meth)acrylic acid heptyl ester, (meth)acrylic acid octyl ester, (meth)acrylic acid 2-ethyhexyl ester, (meth)acrylic acid nonyl ester, (meth)acrylic acid decyl ester, (meth)acrylic acid undecyl ester, and (meth)acrylic acid dodecyl ester. One of these can be used alone, or two or more of these can be used in combination.

Further, it is preferable that the binder polymer that is the (A) component according to this embodiment contain a carboxyl group in view of the alkali developability. The (A) binder polymer containing a carboxyl group can be produced, for example, by radical polymerization of a polymerizable monomer having a carboxyl group and another polymerizable monomer. As the polymerizable monomer having a carboxyl group, (meth)acrylic acids are preferable, and above all, methacrylic acids are more preferable.

In order to improve the alkali developability and the alkali resistance in a balanced manner, it is preferable that the content of the carboxyl group in the (A) binder polymer (the mixing ratio of the polymerizable monomer having a carboxyl group with respect to the total amount of the polymerizable monomers to be used in the binder polymer) be 12 to 50 mass %, it is more preferable to be 12 to 40 mass %, it is further preferable to be 15 to 35 mass %, and it is particularly preferable to be 15 to 30 mass %. When the carboxyl group content is 12 mass % or more, the alkali developability tends to be improved, and when it is 50 mass % or less, the alkali resistance tends to be excellent.

It is preferable that the content of structural units derived from the polymerizable monomer having a carboxyl group in the (A) binder polymer be 12 to 50 mass %, it is more preferable to be 12 to 40 mass %, it is further preferable to be 15 to 35 mass %, and it is particularly preferable to be 15 to 30 mass %, since it correlates to the mixing ratio of the polymerizable monomer having a carboxyl group.

Further, it is preferable that the binder polymer that is the (A) component according to this embodiment contain styrene or styrene derivatives as the polymerizable monomer in view of the adhesion and the chemical resistance. It is preferable that the content of the styrene or styrene derivatives when contained as a copolymerization component (the mixing ratio of the styrene or styrene derivatives with respect to the total amount of the polymerizable monomers to be used in the binder polymer) be 10 to 60 mass %, and it is more preferable to be 15 to 50 mass %, for further enhancing the adhesion and the chemical resistance.

When this content is 10 mass % or more, the adhesion tends to be improved, and when it is 60 mass % or less, there are tendencies that an increase in size of the stripped pieces can be suppressed during the development, and thus an increase in time required for stripping can be suppressed.

It is preferable that the content of the structural units derived from styrene or styrene derivatives in the (A) binder polymer be 10 to 60 mass %, and it is more preferable to be 15 to 50 mass %, since it correlates to the mixing ratio of the styrene or styrene derivatives.

One of these binder polymers can be used alone, or two or more of these binder polymers can be used in combination. In the case of using two or more binder polymers in combination, examples of the (A) binder polymer include two or more binder polymers composed of different copolymerization monomers, two or more binder polymers having different weight-average molecular weights, and two or more binder polymers having different dispersion degrees.

The (A) binder polymer can be produced by a common method. Specifically, it can be produced, for example, by radical polymerization of (meth)acrylic acid alkyl ester, (meth)acrylic acid, and styrene or the like.

It is preferable that the weight-average molecular weight of the (A) binder polymer be 20000 to 300000, it is more preferable to be 40000 to 150000, it is further preferable to be 40000 to 120000, and it is particularly preferable to be 50000 to 80000, in order to improve the mechanical strength and the alkali developability in a balanced manner.

When the weight-average molecular weight of the (A) binder polymer is 20000 or more, the developer resistance tends to be excellent, and when it is 300000 or less, an increase in development time tends to be suppressed. It should be noted that the weight-average molecular weight is a value measured by gel permeation chromatography (GPC) and converted by the calibration curve plotted using standard polystyrene.

It is preferable that the content of the (A) binder polymer be 30 to 80 parts by mass with respect to 100 parts by mass of the total amount of the (A) component and the (B) component which will be described below, it is more preferable to be 40 to 75 parts by mass, and it is further preferable to be 50 to 70 parts by mass. When the content of the (A) component is within this range, the coating properties of the photosensitive resin composition for projection exposure and the strength of the photocured product are more enhanced.

[(B) Photopolymerizable Compound Having an Ethylenically Unsaturated Bond]

The (B) photopolymerizable compound having an ethylenically unsaturated bond (hereinafter, referred to also as "the (B) component") to be used in the photosensitive resin composition for projection exposure according to this embodiment contains at least the (meth)acrylate compound having a skeleton derived from dipentaerythritol, in order to improve the resolution, the adhesion, and the inhibitory properties against the occurrence of resist footing in a balanced manner. Here, the (meth)acrylate compound having a skeleton derived from dipentaerythritol means an esterified product of dipentaerythritol and (meth)acrylic acid, and the esterified product is defined as including a compound modified by an oxyalkylene group. Further, while the number of ester bonds in one molecule is 6, a compound having 1 to 5 ester bonds may be mixed. It is preferable that the (meth)acrylate compound having a skeleton derived from dipentaerythritol have an ethylene oxide chain, that is, it is preferable to be a compound modified by an oxyethylene group, in order to form a resist pattern that is more excellent in resolution, adhesion, and inhibitory properties against the occurrence of resist footing.

More specifically, examples of the (meth)acrylate compound having a skeleton derived from dipentaerythritol include a compound represented by the following formula (II).

Further, the (B) photopolymerizable compound having an ethylenically unsaturated bond to be used in the photosensitive resin composition for projection exposure according to this embodiment contains at least a compound represented by the following formula (III), in order to improve the resolution, the adhesion, and the inhibitory properties against the occurrence of resist footing in a balanced manner.

The compound represented by the following formula (III) is a photopolymerizable compound having a hydrophobic action.

[Chemical Formula 2]

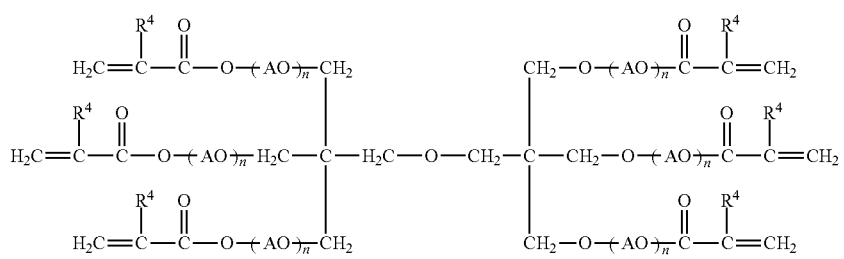

In the formula (II), each $R^4$ independently represents a hydrogen atom or a methyl group.

In the formula (II), A represents an alkylene group having 2 to 6 carbon atoms, and it is preferable that A be an alkylene group having 2 to 5 carbon atoms, and it is more preferable that A be an alkylene group having 2 to 4 carbon atoms. Examples of the alkylene group having 2 to 6 carbon atoms include an ethylene group, a propylene group, an isopropylene group, a butylene group, a pentylene group, and a hexylene group. Among these, the ethylene group or the isopropylene group is preferable, and the ethylene group is more preferable, in order to improve the resolution, the adhesion, and the inhibitory properties against the occurrence of resist footing. It should be noted that, when a plurality of A exist, they may be the same as or different from each other.

In the formula (II), each n independently represents an integer of 0 to 20. In order to further improve the resolution, it is preferable that n be 1 to 20, it is more preferable to be 1 to 7, it is further preferable to be 1 to 5, and it is particularly preferable to be 2 to 4.

Further, it is preferable that the content of the (meth)acrylate compound having a skeleton derived from dipentaerythritol be 3 to 25 parts by mass, and it is more preferable to be 5 to 20 parts by mass, with respect to 100 parts by mass of the total amount of the (A) component and the (B) component, in order to improve the resolution, the adhesion, and the inhibitory properties against the occurrence of resist footing in a balanced manner. Further, it is preferable that the content of the (meth)acrylate compound having a skeleton derived from dipentaerythritol be 5 to 60 mass %, it is more preferable to be 10 to 50 mass %, it is further preferable to be 10 to 40 mass %, and it is particularly preferable to be 10 to 30 mass %, with respect to the total amount of the (B) component.

[Chemical Formula 3]

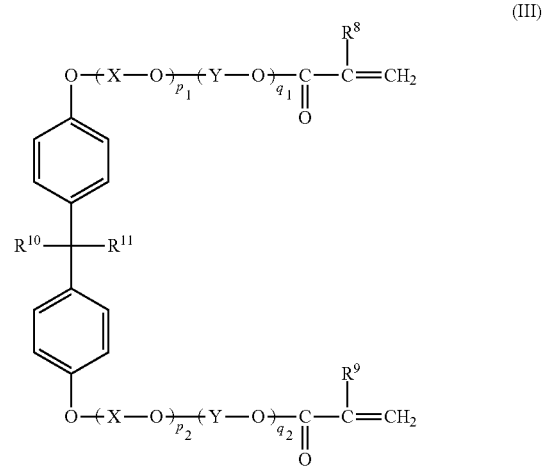

In the formula (II), $R^8$, $R^9$, $R^{10}$, and $R^{11}$ each independently represent a hydrogen atom or a methyl group, X and Y each independently represent an ethylene group or a propylene group, and XO and YO each independently represent an oxyethylene group or an oxypropylene group. In the formula (III), in the case where the oxyethylene group and the oxypropylene group are present, they may be arranged in the form of blocks (block copolymerization), or may be arranged at random (random copolymerization). Further, $p_1$, $p_2$, $q_1$, and $q_2$ each independently represent a numerical value of 0 to 9, both $p_1+q_1$ and $p_2+q_2$ is 1 or more, and $p_1+q_1+p_2+q_2$ is 2 to 9. It should be noted that, since $p_1$, $p_2$, $q_1$, and $q_2$ represent the number of structural units of the oxyethylene group or the oxypropylene group, a single molecule thereof represents an integer value, and a group of a plurality of molecules thereof represents a rational number that is an average.

It is preferable that $p_1+q_1+p_2+q_2$ be more than 2, it is more preferable to be 2.1 to 9.0, and it is further preferable to be 2.3 to 5.0, in order to improve the resolution, the adhesion, and the inhibitory properties against the occurrence of resist footing in a further balanced manner.

In the case where XO is an oxyethylene group and YO is an oxypropylene group in the formula (III), it is preferable that $q_1+q_2$ be 0, in order to further improve the resolution.

Examples of the compound represented by the formula (III) include 2,2-bis(4-((meth)acryloxyethoxy)phenyl)propane, 2,2-bis(4-((meth)acryloxypropoxy)phenyl)propane, 2,2-bis(4-((meth)acryloxyethoxypropoxy)phenyl)propane, 2,2-bis(4-((meth)acryloxypolyethoxy)phenyl)propane, 2,2-bis(4-((meth)acryloxypolypropoxy)phenyl)propane, and 2,2-bis(4-((meth)acryloxypolyethoxypolypropoxy)phenyl)propane. One of these can be used alone, or two or more of these can be used in combination. Further, examples of the compound represented by the formula (III) that are commercially available include BPE-200 as 2,2-bis(4-((meth)acryloxydiethoxy)phenyl)propane, BPE-100 or BPE-80N (product names, both manufactured by Shin-Nakamura Chemical Co., Ltd.) as 2,2-bis(4-((meth)acryloxyethoxy)phenyl)propane, and BP-2EM (product name, manufactured by Kyoeisha Chemical Co., Ltd.).

It is preferable that the content of the compound represented by the formula (III) be 5 to 30 mass %, and it is more preferable to be 6 to 20 mass %, with respect to the total amount of the (A) component and the (B) component. Further, it is preferable that the content of the compound represented by the formula (III) be 15 to 40 mass %, and it is more preferable to be 18 to 30 mass %, with respect to the total amount of the (B) component.

It is preferable that the (B) component contain a bisphenol A-based (meth)acrylate compound other than the compound represented by the above formula (III), in order to improve the resolution, the adhesion, and the inhibitory properties against the occurrence of resist footing in a balanced manner. Examples of the bisphenol A-based (meth)acrylate compound other than the compound represented by the formula (III) that are commercially available include BPE-500 (product name, manufactured by Shin-Nakamura Chemical Co., Ltd.) or FA-321M (product name, manufactured by Hitachi Chemical Company, Ltd.) as 2,2-bis(4-((meth)acryloxypentaethoxy)phenyl)propane, and BPE-1300N (product name, manufactured by Shin-Nakamura Chemical Co., Ltd.) as 2,2-bis(4-((meth)acryloxypentadecaethoxy)phenyl)propane. Among these, 2,2-bis(4-((meth)acryloxypentaethoxy)phenyl)propane is preferable.

It is preferable that the content of the bisphenol A-based (meth)acrylate compound including the compound represented by the formula (III) be 5 to 50 mass %, and it is more preferable to be 28 to 50 mass %, with respect to the total amount of the (A) component and the (B) component.

It is preferable that the content of the bisphenol A-based (meth)acrylate compound including the compound represented by the formula (III) be 40 to 95 mass %, it is more preferable to be 50 to 90 mass %, it is further preferable to be 60 to 90 mass %, and it is particularly preferable to be 70 to 90 mass %, with respect to the total amount of the (B) component.

It is preferable that the (B) component to be used in the photosensitive resin composition for projection exposure according to this embodiment contain 2,2-bis(4-((meth)acryloxypentaethoxy)phenyl)propane as the bisphenol A-based (meth)acrylate compound other than the compound represented by the formula (III), in addition to the (meth)acrylate compound having a skeleton derived from dipentaerythritol and 2,2-bis(4-((meth)acryloxydiethoxy)phenyl)propane as the compound represented by the formula (III), in order to improve the resolution, the adhesion, and the inhibitory properties against the occurrence of resist footing in a further balanced manner.

As the (B) component, other photopolymerizable compounds than the (meth)acrylate compound having a skeleton derived from dipentaerythritol and the bisphenol A-based (meth)acrylate compound can be used.

Examples of the other photopolymerizable compounds include compounds obtained by reaction of α, β-unsaturated carboxylic acid with polyhydric alcohols, urethane monomers such as a (meth)acrylate compound having an urethane bond, nonyl phenoxy ethyleneoxy (meth)acrylate, nonylphenoxyoctaethyleneoxy (meth)acrylate, γ-chloro-β-hydroxypropyl-3'-(meth)acryloyloxyethyl-o-phthalate, β-hydroxyethyl-β'-(meth)acryloyloxyethyl-o-phthalate, O-hydroxypropyl-β'-(meth)acryloyloxyethyl-o-phthalate, and (meth)acrylic acid alkyl ester. One of these can be used alone, or two or more of these can be used in combination.

Examples of the compounds obtained by reaction of a, β-unsaturated carboxylic acid with polyhydric alcohols include polyethylene glycol di(meth)acrylate having 2 to 14 ethylene groups, polypropylene glycol di(meth)acrylate having 2 to 14 propylene groups, polyethylene polypropylene glycol di(meth)acrylate having 2 to 14 ethylene groups and 2 to 14 propylene groups, trimethylol propane polyethylene tri(meth)acrylate having 1 to 21 ethylene groups, tetramethylolmethane polyethylene tri(meth)acrylate having 1 to 21 ethylene groups, and tetramethylolmethane polyethylene tetra(meth)acrylate having 1 to 30 ethylene groups. One of these can be used alone, or two or more of these can be used in combination.

One of the other photopolymerizable compounds described above can be used alone, or two or more of them can be used in combination.

It is preferable that the content of the (B) component be 20 to 70 parts by mass, it is more preferable to be 25 to 60 parts by mass, and it is particularly preferable to be 30 to 50 parts by mass, with respect to 100 parts by mass of the total amount of the (A) component and the (B) component. When the content of the (B) component is within this range, the photosensitivity and the coating properties of the photosensitive resin composition are more enhanced, in addition to the resolution, the adhesion, and the inhibitory properties against the occurrence of resist footing.

[(C) Photopolymerization Initiator]

Examples of the (C) photopolymerization initiator (hereinafter, referred to also as "(C) component") include aromatic ketones such as benzophenone, 2-benzyl-2-dimethylamino-1-(4-morpholinophenyl)-butanone-1, and 2-methyl-1-[4-(methylthio) phenyl]-2-morpholino-propanone-1, quinones such as alkyl anthraquinone, benzoin ether compounds such as benzoin alkyl ether, benzoin compounds such as benzoin and alkyl benzoin, benzyl derivatives such as benzyldimethylketal, 2,4,5-triaryl imidazole dimers such as 2-(o-chlorophenyl)-4,5-diphenyl imidazole dimer and 2-(o-fluorophenyl)-4,5-diphenyl imidazole dimer, and acridine derivatives such as 9-phenyl acridine and 1,7-(9,9'-acridinyl) heptane. One of these can be used alone, or two or more of these can be used in combination.

Among these, it is preferable that the 2,4,5-triaryl imidazole dimers be contained. Examples of the 2,4,5-triaryl imidazole dimers include 2-(o-fluorophenyl)-4,5-diphenyl imidazole dimer, 2-(o-chlorophenyl)-4,5-diphenyl imidazole dimer, 2-(o-chlorophenyl)-4,5-bis-(m-methoxyphenyl) imidazole dimer, and 2-(p-methoxyphenyl)-4,5-diphenylimidazole dimer. Among these, 2-(o-chlorophenyl)-4,5-diphenylimidazole dimer is preferable.

Examples of the 2,4,5-triaryl imidazole dimers include 2,2'-bis(2-chlorophenyl)-4,4',5,5'-tetraphenylbisimidazole, which is commercially available as B-CIM (product name, manufactured by Hodogaya Chemical Co., Ltd.).

It is preferable that the content of the (C) component be 0.01 to 30 parts by mass, it is more preferable to be 0.1 to 10 parts by mass, it is further preferable to be 1 to 7 parts by mass, it is particularly preferable to be 1 to 6 parts by mass, it is exceptionally preferable to be 2 to 6 parts by mass, and it is exceptionally particularly preferable to be 3 to 5 parts by mass, with respect to 100 parts by mass of the total amount of the (A) component and the (B) component. When the content of the (C) component is 0.01 part by mass or more with respect to 100 parts by mass of the total amount of the (A) component and the (B) component, the photosensitivity, the resolution, or the adhesion tends to be improved, and when it is 30 parts by mass or less, the resist shape tends to be excellent.

[(D) Sensitizing Dye]

Examples of the (D) sensitizing dye (hereinafter, referred to also as "(D) component") include dialkylaminobenzophenones, anthracenes, coumarins, xanthones, oxazoles, benzoxazoles, thiazoles, benzothiazoles, triazoles, stilbenes, triazines, thiophenes, naphthalimides, pyrazolines, and triarylaminess. One of these can be used alone, or two or more of these can be used in combination. Among these, it is preferable that dialkylaminobenzophenones or pyrazolines be contained. Examples of the dialkylaminobenzophenones include 4,4'-bis(diethylamino)benzophenone, which is commercially available as EAB (product name, manufactured by Hodogaya Chemical Co., Ltd.). Examples of the pyrazolines include 1-phenyl-3-(4-methoxystyryl)-5-(4-methoxyphenyl) pyrazoline) (manufactured by NIPPON CHEMICAL INDUSTRIAL CO., LTD.), which is commercially available.

It is preferable that the content of the dialkylaminobenzophenones in the sensitizing dye serving as the (D) component be 10 mass % to 100 mass %, it is more preferable to be 30 mass % to 100 mass %, and it is particularly preferable to be 50 to 100 mass %, with respect to the total amount of the (D) component. When the content is 10 mass % or more, the sensitivity and the resolution tend to be enhanced.

It is preferable that the content of the (D) component be 0.01 to 10 parts by mass, it is more preferable to be 0.05 to 5 parts by mass, and it is further preferable to be 0.1 to 3 parts by mass, with respect to 100 parts by mass of the total amount of the (A) component and the (B) component. When this content is 0.01 part by mass or more, sufficiently good photosensitivity and resolution tend to be obtained, and when it is 10 parts by mass or less, sufficiently good resist shape tends to be obtained.

[Other Components]

Further, the photosensitive resin composition for projection exposure according to this embodiment can contain additives such as dyes, e.g., malachite green, Victoria pure blue, brilliant green, and methyl violet, photochromic agents, e.g., tribromophenylsulfone, leuco crystal violet, diphenyl amine, benzyl amine, triphenylamine, diethyl aniline, o-chloroaniline, and tertiary butyl catechol, thermal coloring inhibitors, plasticizers, e.g., p-toluenesulfonamide, pigments, fillers, defoamers, flame retardants, adhesion imparting agents, leveling agents, stripping accelerators, antioxidants, perfumes, imaging agents, thermal crosslinking agents, and polymerization inhibitors, as needed, each in an amount of 0.01 to 20 parts by mass with respect to 100 parts by mass of the total amount of the (A) component and the (B) component. One of these additives can be used alone, or two or more of them can be used in combination.

The photosensitive resin composition for projection exposure according to this embodiment can contain at least one organic solvent, as needed. As the organic solvent, commonly used organic solvents can be used without particular limitation. Specific examples thereof include organic solvents such as methanol, ethanol, acetone, methyl ethyl ketone, methyl cellosolve, ethyl cellosolve, toluene, N,N-dimethylformamide, and propylene glycol monomethyl ether, or mixed solvents thereof.

The photosensitive resin composition for projection exposure according to this embodiment is used for application of projection exposure. Further, the photosensitive resin composition for projection exposure according to this embodiment can be used suitably for methods for forming resist patterns, among which, application to production methods for forming conductor patterns by plating is more suitable. The photosensitive resin composition for projection exposure according to this embodiment can be used, as a solution with a solid content of 30 to 60 mass % (hereinafter, referred to also as "coating solution"), for example, by dissolving the (A) binder polymer, the (B) photopolymerizable compound having an ethylenically unsaturated bond, the (C) photopolymerization initiator, and the (D) sensitizing dye in such an organic solvent described above. It should be noted that the solid content means the residual components after removing volatile components from the solution (coating solution). That is, the solid content includes materials in liquid form, syrup form and wax form at room temperature of about 25° C., and does not necessarily mean to be solid.

The coating solution can be used for forming a photosensitive resin layer for projection exposure (which hereinafter may be simply referred to as "photosensitive resin layer" in some cases), for example, as follows. A photosensitive resin layer derived from the photosensitive resin composition for projection exposure can be formed on a support such as a support film and a metal plate, which will be described below, by applying the coating solution onto the surface of the support, followed by drying.

Examples of the metal plate include metal plates made of copper, copper alloys, nickel, chromium, iron, or iron alloys such as stainless steel, and preferable examples thereof include metal plates made of copper, copper alloys, or iron alloys.

It is preferable that the thickness of the photosensitive resin layer for projection exposure to be formed be 1 to 100 μm after drying, though it differs depending on the intended use. The surface (front surface) of the photosensitive resin layer for projection exposure opposite to the surface opposed to the support may be covered by a protective layer. Examples of the protective layer include films of polymers such as polyethylene and polypropylene.

<Photosensitive Element>

The photosensitive element according to this embodiment relates to a photosensitive element having a support, and a photosensitive resin layer formed on the support using the above photosensitive resin composition for projection exposure. As shown in a schematic sectional view of an example thereof in FIG. 1, a photosensitive element 1 according to this embodiment is configured to include a support 2, and a photosensitive resin layer 3 for projection exposure that is derived from the above photosensitive resin composition for projection exposure and is formed on the support 2, and to include a protective layer 4 and other layers, as needed.

[Support]

Examples of the support that can be used include films of polymers (which will be referred to also as "support films") having heat resistance and solvent resistance such as polypropylene, polyethylene, and polyester, e.g., polyethylene terephthalate.

It is preferable that the thickness of the support be 1 to 100 µm, it is more preferable to be 1 to 50 µm, and it is further preferable to be 1 to 30 µm. By the thickness of the support being 1 µm or more, the support tends to be suppressed from being torn when the support is peeled off. Further, by the thickness of the support being 100 µm or less, a reduction in resolution tends to be suppressed.

[Protective Layer]

The above photosensitive element may further include the protective layer 4 covering the surface (front surface) of the photosensitive resin layer 3 for projection exposure opposite to the surface opposed to the support 2, as needed.

It is preferable that the adhesiveness of the protective layer to the photosensitive resin layer for projection exposure be lower than the adhesiveness of the support to the photosensitive resin layer for projection exposure, and a film with low fisheye is preferable. Here, the "fisheye" means incorporation of foreign matter in materials, undissolved materials, oxidative degradation products, or the like into the film, during the production of the film by thermal fusion, kneading, extrusion, biaxial stretching, casting or the like of the materials constituting the protective layer. That is, "low fisheye" means that the foreign matter or the like incorporated in the film is at a low level.

Specifically, examples of the protective layer that can be used include films of polymers having heat resistance and solvent resistance such as polypropylene, polyethylene, and polyester, e.g., polyethylene terephthalate. Examples of commercially available films include ALPHAN MA-410 and E-200C, manufactured by Oji Paper Co., Ltd., polypropylene films, manufactured by SHIN-ETSU FILM CO., LTD., and polyethylene terephthalate films such as PS Series, e.g., PS-25, manufactured by TEIJIN LIMITED. It should be noted that the protective layer may be the same as the above support.

It is preferable that the thickness of the protective layer be 1 to 100 µm, it is more preferable to be 5 to 50 µm, it is further preferable to be 5 to 30 µm, and it is particularly preferable to be 15 to 30 µm. By the thickness of the protective layer being 1 µm or more, the protective layer tends to be suppressed from being torn when the photosensitive resin layer for projection exposure and the support are laminated onto the substrate while the protective layer is peeled off. Further, it is preferable that the thickness be 100 m or less from the economic viewpoint.

[Method for Producing Photosensitive Element]

The photosensitive element according to this embodiment can be produced, for example, as follows. It can be produced by a production method including: a step of preparing a coating solution by dissolving the photosensitive resin composition for projection exposure in the above organic solvent, a step of forming a coating layer by applying the coating solution onto the support, and a step of forming a photosensitive resin layer for projection exposure by drying the coating layer.

The application of the coating solution onto the support can be performed by a known method, for example, using roll coating, comma coating, gravure coating, air knife coating, die coating, bar coating, and spray coating.

Further, the drying of the coating layer is not particularly limited as long as at least a part of the organic solvent can be removed from the coating layer. For example, it can be performed at 70 to 150° C. for 5 to 30 minutes. It is preferable that the amount of the residual organic solvent in the photosensitive resin layer for projection exposure after drying be 2 mass % or less, in order to prevent diffusion of the organic solvent in the subsequent steps.

Although the thickness of the photosensitive resin layer for projection exposure in the photosensitive element can be appropriately selected depending on the intended use, it is preferable that the thickness after drying be 1 to 200 µm, it is more preferable to be 5 to 100 µm, and it is particularly preferable to be 10 to 50 µm. By the thickness of the photosensitive resin layer being 1 µm or more, there is a tendency that industrial coating is facilitated, so that the productivity is improved. Further, in the case where the thickness of the photosensitive resin layer is 200 µm or less, there is a tendency that a resist pattern having high photosensitivity, excellent photocurability at the bottom of the resist, excellent adhesion, excellent resolution, and excellent inhibitory properties against the occurrence of resist footing can be formed.

The photosensitive element according to this embodiment may further have interlayers such as a cushion layer, an adhesive layer, a light absorption layer, or a gas barrier layer, as needed.

The forms of the photosensitive element according to this embodiment are not particularly limited. For example, the photosensitive element may be in sheet form, or may be in roll form wound about a winding core. In the case where the photosensitive element is wound into a roll, it is preferable that it is wound so that the support is on the outer side. Examples of the winding core include plastics such as polyethylene resin, polypropylene resin, polystyrene resin, polyvinyl chloride resin, or ABS (acrylonitrile-butadiene-styrene copolymer).

It is preferable that edge separators be provided on the edges of the thus obtained photosensitive element in roll form for edge protection, and it is preferable that moisture-proof edge separators be provided for resistance to edge fusion. As a packing method, wrap packaging with a black sheet having low moisture permeability is preferable.

The photosensitive element according to this embodiment can be used suitably, for example, for the method for forming a resist pattern, which will be described below.

<Method for Forming a Resist Pattern>

The method for forming a resist pattern according to this embodiment relates to a method for forming a resist pattern, including: (i) a photosensitive resin layer forming step of forming a photosensitive resin layer on a substrate using the above photosensitive resin composition for projection exposure, (ii) an exposure step of exposing at least a part of the photosensitive resin layer to active light projecting an image of a photomask via a lens to photocure the exposed portions, and (iii) a development step of removing uncured portions of the photosensitive resin layer from the substrate by development. The method for forming a resist pattern according to this embodiment may further include other steps, as needed.

(i) Photosensitive Resin Layer Forming Step

In the photosensitive resin layer forming step, a photosensitive resin layer derived from the above photosensitive resin composition for projection exposure is formed on a substrate. The substrate is not particularly limited, but circuit-forming boards including an insulating layer and a conductor layer formed on the insulating layer, or die pads (substrates for lead frame) such as alloy substrates are generally used as the substrate.

Examples of a method for forming the photosensitive resin layer on the substrate include a method using the above photosensitive element. In the case of the photosensitive element having a protective layer, the method can be performed, after the protective layer is removed, by pressure bonding the photosensitive resin layer of the photosensitive element to the substrate under heating. This allows a laminated product including the substrate, the photosensitive resin layer, and the support in this order to be obtained.

In the case of performing the photosensitive resin layer forming step using the photosensitive element, it is preferable to perform it under reduced pressure, in view of the adhesion and the followability. It is preferable to perform the heating during the pressure bonding at a temperature of 70 to 130° C. Further, it is preferable to perform the pressure bonding at a pressure of 0.1 to 1.0 MPa (1 to 10 kgf/cm$^2$), but these conditions are appropriately selected, as needed. It should be noted that, when the photosensitive resin layer of the photosensitive element is heated to 70 to 130° C., there is no need to preheat the substrate in advance, but the substrate can be preheated in order to further improve the adhesion and the followability.

(ii) Exposure Step

In the exposure step, at least a part of the photosensitive resin layer formed on the substrate is irradiated with active light projecting an image of a photomask via a lens, thereby allowing portions irradiated with the active light (hereinafter, referred to also as "exposed portions") to be photocured, so that photocured portions (latent image) are formed. In this regard, when the photosensitive resin layer is formed using the photosensitive element, if the support present on the photosensitive resin layer is transparent to the active light, the photosensitive resin layer can be irradiated with the active light through the support, whereas if the support blocks the active light, the photosensitive resin layer is irradiated with the active light after the support is removed.

The exposure method may be used in combination with other exposure method than the above projection exposure method. Examples of the other exposure method that can be used in combination include a method of performing imagewise irradiation with the active light via a negative or positive mask pattern called artwork (mask exposure method).

Examples of light sources of the active light to be used include known light sources such as carbon arc lamps, mercury vapor arc lamps, ultrahigh pressure mercury lamps, high-pressure mercury lamps, xenon lamps, and gas lasers such as argon lasers; and lasers that effectively emit ultraviolet rays such as solid lasers, e.g., YAG lasers and semiconductor lasers, e.g., gallium nitride blue-violet lasers. Further, light sources that effectively emit visible light such as photoflood lamps and solar lamps may be used.

(iii) Development Step

In the development step, the uncured portions (unexposed portions) of the photosensitive resin layer are removed from the substrate by development, thereby allowing a resist pattern composed of a cured product obtained by photocuring the above photosensitive resin layer to be formed on the substrate.

When the photosensitive resin layer is formed using the photosensitive element, if the support is present on the photosensitive resin layer; the unexposed portions other than the exposed portions are removed (developed) after the support is removed. The development method includes wet development and dry development.

In the case of the wet development, development can be performed by a known wet development method using a developer corresponding to the photosensitive resin composition for projection exposure. Examples of the wet development method include dipping, paddling, high-pressure spraying, brushing, slapping, scrubbing, and shaking immersion methods, among which the high-pressure spraying method is most suitable for improving the resolution. Two or more of these wet development methods may be combined for the development.

The configuration of the developer is appropriately selected corresponding to the configuration of the above photosensitive resin composition for projection exposure. Examples thereof include an alkaline aqueous solution, an aqueous developer, and an organic solvent developer.

The alkaline aqueous solution, when used as the developer, is safe and stable, having good handleability. Examples of the base of the alkaline aqueous solution to be used include alkali hydroxides such as hydroxides of lithium, sodium, or potassium, alkaline carbonates such as carbonates or bicarbonates of lithium, sodium, potassium, or ammonium, alkali metal phosphates such as potassium phosphate and sodium phosphate, and alkali metal pyrophosphates such as sodium pyrophosphate and potassium pyrophosphate.

As the alkaline aqueous solution to be used for development, a 0.1 to 5 mass % dilute solution of sodium carbonate, a 0.1 to 5 mass % dilute solution of potassium carbonate, a 0.1 to 5 mass % dilute solution of sodium hydroxide, a 0.1 to 5 mass % dilute solution of sodium tetraborate, or the like, is preferable. Further, it is preferable that the pH of the alkaline aqueous solution to be used for development be within the range of 9 to 11, and the temperature thereof is adjusted according to the developability of the photosensitive resin layer.

Further, a surface active agent, a defoamer, a small amount of an organic solvent for promoting development, or the like, may be incorporated into the alkaline aqueous solution, for example.

Examples of the aqueous developer include a developer composed of water or an alkaline aqueous solution and one or more organic solvents. Here, examples of the base of the alkaline aqueous solution include sodium borate, sodium metasilicate, tetramethylammonium hydroxide, ethanolamine, ethylenediamine, diethylenetriamine, 2-amino-2-hydroxymethyl-1,3-propanediol, 1,3-diaminopropanol-2, and morpholine, other than the materials described above. It is preferable that the pH of the aqueous developer be lowered as much as possible within the range that allows sufficient development, where it is preferable to be pH8 to 12, and it is more preferable to be pH9 to 10.

Examples of the organic solvent used for the aqueous developer include 3-acetone alcohol, acetone, ethyl acetate, alkoxy ethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether. One of these can be used alone, or two or more of these can be used in combination. It is generally preferable that the concentration of the organic solvent in the aqueous developer be 2 to 90 mass %, and the temperature thereof can be adjusted according to the developability. A small amount of a surfactant, a defoamer, or the like may be incorporated into the aqueous developer.

Examples of the organic solvent to be used for the organic solvent developer include 1,1,1-trichloroethane, N-methylpyrrolidone, N,N-dimethylformamide, cyclohexanone, methyl isobutyl ketone, and γ-butyrolactone. It is preferable that water be added to the organic solvents within the range of 1 to 20 mass % for preventing catching fire to prepare the organic solvent developer.

In this embodiment, the resist pattern may be further cured for use by heating at 60 to 250° C. or performing exposure with an amount of 0.2 to 10 J/cm², after the unexposed portions are removed in the development step, as needed.

<Process for Producing Printed Wiring Board>

The process for producing a printed wiring board according to this embodiment relates to a process for producing a printed wiring board, including: a step of forming a conductor pattern by etching or plating the substrate on which the resist pattern is formed by the above method for forming a resist pattern. Further, the process for producing a printed wiring board according to this embodiment may be configured to include other steps such as a resist pattern removing step, as needed.

In etching, the resist pattern formed on the substrate provided with a conductor layer is used as a mask, and the conductor layer on the substrate that is not covered by the resist is removed by etching to form a conductor pattern.

The etching method is appropriately selected corresponding to the conductor layer to be removed. Examples of an etchant include copper(II) chloride solution, iron(II) chloride solution, alkaline etchants, and hydrogen peroxide etchants, and it is desirable to use iron(II) chloride solution because of its good etch factor.

Meanwhile, in plating, the resist pattern formed on the substrate provided with a conductor layer is used as a mask, and the conductor layer on the substrate that is not covered by the resist is plated, for example, with copper or solder. After plating, the resist is removed by removing the resist pattern, which will be described below, and further the conductor layer covered by the resist is etched to form a conductor pattern.

The plating method may be either electrolytic plating, or electroless plating, but electroless plating is preferable. Examples of the electroless plating include copper plating such as copper sulfate plating and copper pyrophosphate plating, solder plating such as high throw plating, nickel plating such as a Watts bath (nickel sulfate-nickel chloride) plating and nickel sulfamate plating, and gold plating such as hard gold plating and soft gold plating.

After the above etching or plating, the resist pattern on the substrate is removed. The resist pattern can be removed by being stripped away, for example, using a stronger alkaline aqueous solution than the alkaline aqueous solution used in the above development step.

Examples of the stronger alkaline aqueous solution to be used include a 1 to 10 mass % aqueous solution of sodium hydroxide and a 1 to 10 mass % aqueous solution of potassium hydroxide. Above all, it is preferable to use a 1 to 5 mass % aqueous solution of sodium hydroxide or a 1 to 5 mass % aqueous solution of potassium hydroxide.

Examples of the method for stripping away the resist pattern include, for example, an immersion method and a spraying method, and these methods may be individually used or may be used in combination.

In the case where the resist pattern is removed after plating, a desired printed wiring board can be produced by further etching the conductor layer covered by the resist to form a conductor pattern. The etching method herein is appropriately selected corresponding to the conductor layer to be removed. For example, the etchant described above can be used.

The process for producing a printed wiring board according to this embodiment can be used, not only for producing single-layer printed wiring boards, but also for producing multilayer printed wiring boards, and can be used also for producing printed wiring boards having small diameter through-holes.

Figure 2:
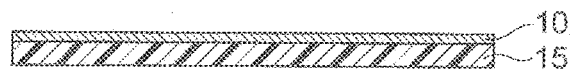
FIG. 2 is a view schematically showing an example of a process for producing a printed wiring board by a semi-additive process.
Figure 2:
Figure 2:
Figure 2:
Figure 2:
Figure 2:
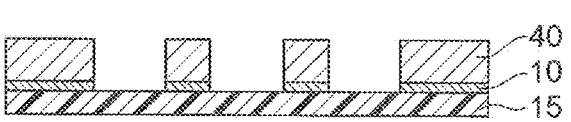

The process for producing a printed wiring board according to this embodiment can be used suitably for producing high-density package substrates, particularly, circuit boards by the semi-additive process. It should be noted that an example of the process for producing circuit boards by the semi-additive process is shown in FIG. 2.

In FIG. 2(a), a substrate (circuit-forming board) in which a conductor layer 10 is formed on an insulating layer 15 is prepared. The conductor layer 10 is, for example, a metal copper layer. In FIG. 2(b), a photosensitive resin layer 32 for projection exposure is laminated on the conductor layer 10 of the substrate by the above photosensitive resin layer forming step. In FIG. 2(c), the photosensitive resin layer 32 for projection exposure is irradiated with active light 50 projecting an image of a photomask, and the photosensitive resin layer 32 for projection exposure is exposed thereto, so that photocured portions are formed. In FIG. 2(d), the region other than the photocured portions formed by the above exposure step is removed from the substrate by the development step, so that a resist pattern 30 that is the photocured portions is formed on the substrate. In FIG. 2(e), a plating layer 42 is formed on the conductor layer 10 of the substrate that is not covered by the resist, by plating using the resist pattern 30 that is the photocured portions as a mask. In FIG. 2(f), after the resist pattern 30 that is the photocured portions is stripped away using a strong alkaline aqueous solution, a part of the plating layer 42 and the conductor layer 10 masked by the resist pattern 30 are removed by flash etching to form a circuit pattern 40. It should be noted that the materials of the conductor layer 10 and the plating layer 42 may be the same as or different from each other, but in the case where the materials of the conductor layer 10 and the plating layer 42 are the same, the conductor layer 10 and the plating layer 42 are integrated together.

<Process for Producing Lead Frame>

The process for producing a lead frame according to this embodiment relates to a process for producing a lead frame, including: a step of forming a conductor pattern by plating a substrate on which a resist pattern is formed by the above method for forming a resist pattern. Further, the process for producing a lead frame according to this embodiment may be configured to include other steps such as a resist pattern removing step and an etching step, as needed.

Examples of the substrate to be used include die pads (substrates for lead frame) such as alloy substrates. In this embodiment, the substrate is plated with the resist pattern formed on the substrate as a mask.

Examples of the plating method include methods described above for the process for producing a printed wiring board. After the plating, the resist pattern on the substrate is removed. The resist pattern can be removed by being stripped away, for example, using a stronger alkaline aqueous solution than the alkaline aqueous solution used in the development step. Examples of the stronger alkaline aqueous solution include the solutions described above for the process for producing a printed wiring board.

Examples of the method for stripping away the resist pattern include an immersion method and a spraying method, and these methods may be individually used or may be used in combination. A lead frame can be produced by removing unnecessary metal layers by further etching, after the resist pattern is removed.

Suitable embodiments of the present invention have been described above, but the present invention is not limited to the above embodiments.

EXAMPLES

Hereinafter, the present invention will be described further specifically by way of examples, but the present invention is not limited to these examples. It should be noted that "part(s)" and "%" are based on mass, unless otherwise specified.

Examples 1 to 12 and Comparative Examples 1 to 12

First, a binder polymer (A-1) shown in the following Tables 1 to 4 was synthesized according to Synthesis Example 1, and a binder polymer (A-2) shown therein was synthesized according to Synthesis Example 2.

Synthesis Example 1

125 g of methacrylic acid, 25 g of methyl methacrylate, 125 g of benzyl methacrylate, and 225 g of styrene as copolymerization monomers were mixed with 1.5 g of azobisisobutyronitrile to prepare Solution a. Further, 1.2 g of azobisisobutyronitrile was dissolved in 100 g of a mixed solution (mass ratio of 6:4) of 60 g of methyl cellosolve and 40 g of toluene to prepare Solution b.

Meanwhile, 400 g of a mixture (hereinafter, referred to as "mixture x") of methyl cellosolve and toluene with a mass ratio of 6:4 was added to a flask provided with a stirrer, a reflux condenser, a thermometer, a dropping funnel, and a nitrogen gas introducing tube, which was stirred with nitrogen gas blowing therein, followed by heating to 80° C.

To the mixture x in the flask was added dropwise the above Solution a over 4 hours at a constant dropping rate, which was thereafter stirred at 80° C. for 2 hours. Subsequently, to the solution in the flask was added dropwise the above Solution b over 10 minutes at a constant dropping rate, and thereafter the solution in the flask was stirred for 3 hours at 80° C. Further, the temperature of the solution in the flask was raised to 90° C. over 30 minutes, and was maintained at 90° C. for 2 hours, followed by cooling to room temperature, to obtain a solution of the binder polymer (A-1). Acetone was added to the solution of the binder polymer (A-1) for preparation such that its non-volatile components (solid content) account for 50 mass %. It should be noted that the room temperature in the present invention was 25° C.

Synthesis Example 2

125 g of methacrylic acid, 25 g of methyl methacrylate, 125 g of phenoxyethyl methacrylate, and 225 g of styrene as copolymerization monomers were mixed with 1.5 g of azobisisobutyronitrile to prepare Solution c. Further, 1.2 g of azobisisobutyronitrile was dissolved in 100 g of a mixed solution (mass ratio of 6:4) of 60 g of methyl cellosolve and 40 g of toluene to prepare a Solution d.

Meanwhile, 400 g of the mixture x was added to a flask provided with a stirrer, a reflux condenser, a thermometer, a dropping funnel, and a nitrogen gas introducing tube, which was stirred with nitrogen gas blowing therein, followed by heating to 80° C.

To the mixture x in the flask was added dropwise the above Solution c over 4 hours at a constant dropping rate, which was thereafter stirred at 80° C. for 2 hours. Subsequently, to the solution in the flask was added dropwise the Solution d over 10 minutes at a constant dropping rate, and thereafter the solution in the flask was stirred for 3 hours at 80° C. Further, the temperature of the solution in the flask was raised to 90° C. over 30 minutes, and was maintained at 90° C. for 2 hours, followed by cooling to room temperature, to obtain a solution of the binder polymer (A-2). Acetone was added to the solution of the binder polymer (A-2) for preparation such that its non-volatile components (solid content) account for 50 mass %.

The weight-average molecular weight of the binder polymer (A-1) was 50000, and the acid value thereof was 163 mgKOH/g. Further, the weight-average molecular weight of the binder polymer (A-2) was 50000, and the acid value thereof was 163 mgKOH/g. It should be noted that the weight-average molecular weight was measured by gel permeation chromatography (GPC), and was derived by conversion using a calibration curve of standard polystyrene. The conditions of the GPC were as follows.

GPC conditions
Pump: HITACHI L-6000 type (manufactured by Hitachi, Ltd.)
Column: Gelpack GL-R420+Gelpack GL-R430+Gelpack GL-R440 (3 columns in total) (product names, manufactured by Hitachi Chemical Company, Ltd.)
Eluent: Tetrahydrofuran
Measurement temperature: 25° C.
Flow rate: 2.05 mL/minute
Detector: HITACHI L-3300 type RI (product name, manufactured by Hitachi, Ltd.)

<Preparation of Photosensitive Resin Composition>

Next, the respective components shown in the following Tables 1 to 4 were mixed in amounts shown in the tables, to obtain the photosensitive resin compositions of Examples 1 to 12 and Comparative Examples 1 to 12. It should be noted that the numerical values in the tables represent the mixed parts (based on mass). Further, the amounts of the (A) component and the (B) component are both expressed as the mass of solid content.

TABLE 1

| | Component | Example 1 | Example 2 | Example 3 | Example 4 | Example 5 | Example 6 |
|---|---|---|---|---|---|---|---|
| (A) Component | (A-1)*1 | 55 | 55 | 55 | 55 | 55 | 55 |
| | (A-2)*2 | — | — | — | — | — | — |
| (B) Component | (B-1)*3 | 5 | — | — | — | — | — |
| | (B-2)*4 | — | 5 | — | 5 | 5 | 5 |
| | (B-3)*5 | — | — | 5 | — | — | — |
| | FA-024M*6 | — | — | — | — | — | — |
| | TMPT*7 | — | — | — | — | — | — |

TABLE 1-continued

| | Component | Example 1 | Example 2 | Example 3 | Example 4 | Example 5 | Example 6 |
|---|---|---|---|---|---|---|---|
| | A-TMMT*8 | — | — | — | — | — | — |
| | FA-321M*9 | 30 | 30 | 30 | 30 | 30 | 30 |
| | BPE-200*10 | 10 | 10 | 10 | — | — | — |
| | BPE-100*11 | — | — | — | 10 | — | — |
| | BPE-80N*12 | — | — | — | — | 10 | 10 |
| (C) Component | B-CIM*13 | 2.9 | 2.9 | 2.9 | 2.9 | 2.9 | 2.9 |
| (D) Component | EAB*14 | 0.1 | 0.1 | 0.1 | 0.1 | 0.1 | — |
| | Pyrazoline compound*15 | — | — | — | — | — | 0.02 |
| Additive | Leuco crystal violet | 0.3 | 0.3 | 0.3 | 0.3 | 0.3 | 0.3 |
| | Malachite green | 0.05 | 0.05 | 0.05 | 0.05 | 0.05 | 0.05 |
| Organic solvent | Acetone | 10 | 10 | 10 | 10 | 10 | 10 |
| | Toluene | 10 | 10 | 10 | 10 | 10 | 10 |
| | Methanol | 10 | 10 | 10 | 10 | 10 | 10 |

TABLE 2

| | Component | Comparative Example 1 | Comparative Example 2 | Comparative Example 3 | Comparative Example 4 | Comparative Example 5 | Comparative Example 6 |
|---|---|---|---|---|---|---|---|
| (A) Component | (A-1)*1 | 55 | 55 | 55 | 55 | 55 | 55 |
| | (A-2)*2 | — | — | — | — | — | — |
| (B) Component | (B-1)*3 | — | — | — | — | — | 5 |
| | (B-2)*4 | — | — | — | — | — | — |
| | (B-3)*5 | — | — | — | — | — | — |
| | FA-024M*6 | 5 | — | — | — | — | 5 |
| | TMPT*7 | — | 5 | — | — | — | — |
| | A-TMMT*8 | — | — | 5 | — | — | — |
| | FA-321M*9 | 30 | 30 | 30 | 35 | 30 | 35 |
| | BPE-200*10 | 10 | 10 | 10 | 10 | 15 | — |
| | BPE-100*11 | — | — | — | — | — | — |
| | BPE-80N*12 | — | — | — | — | — | — |
| (C) Component | B-CIM*13 | 2.9 | 2.9 | 2.9 | 2.9 | 2.9 | 2.9 |
| (D) Component | EAB*14 | 0.1 | 0.1 | 0.1 | 0.1 | 0.1 | 0.1 |
| Additive | Leuco crystal violet | 0.3 | 0.3 | 0.3 | 0.3 | 0.3 | 0.3 |
| | Malachite green | 0.05 | 0.05 | 0.05 | 0.05 | 0.05 | 0.05 |
| Organic solvent | Acetone | 10 | 10 | 10 | 10 | 10 | 10 |
| | Toluene | 10 | 10 | 10 | 10 | 10 | 10 |
| | Methanol | 10 | 10 | 10 | 10 | 10 | 10 |

TABLE 3

| | Component | Example 7 | Example 8 | Example 9 | Example 10 | Example 11 | Example 12 |
|---|---|---|---|---|---|---|---|
| (A) Component | (A-1)*1 | — | — | — | — | — | — |
| | (A-2)*2 | 55 | 55 | 55 | 55 | 55 | 55 |
| (B) Component | (B-1)*3 | 5 | — | — | — | — | — |
| | (B-2)*4 | — | 5 | — | 5 | 5 | 5 |
| | (B-3)*5 | — | — | 5 | — | — | — |
| | FA-024M*6 | — | — | — | — | — | — |
| | TMPT*7 | — | — | — | — | — | — |
| | A-TMMT*8 | — | — | — | — | — | — |
| | FA-321M*9 | 30 | 30 | 30 | 30 | 30 | 30 |
| | BPE-200*10 | 10 | 10 | 10 | — | — | — |
| | BPE-100*11 | — | — | — | 10 | — | — |
| | BPE-80N*12 | — | — | — | — | 10 | 10 |
| (C) Component | B-CIM*13 | 2.9 | 2.9 | 2.9 | 2.9 | 2.9 | 2.9 |

TABLE 3-continued

| | Component | Example 7 | Example 8 | Example 9 | Example 10 | Example 11 | Example 12 |
|---|---|---|---|---|---|---|---|
| (D) Component | EAB*14 | 0.1 | 0.1 | 0.1 | 0.1 | 0.1 | — |
| | Pyrazoline compound*15 | — | — | — | — | — | 0.02 |
| Additive | Leuco crystal violet | 0.3 | 0.3 | 0.3 | 0.3 | 0.3 | 0.3 |
| | Malachite green | 0.05 | 0.05 | 0.05 | 0.05 | 0.05 | 0.05 |
| Organic solvent | Acetone | 10 | 10 | 10 | 10 | 10 | 10 |
| | Toluene | 10 | 10 | 10 | 10 | 10 | 10 |
| | Methanol | 10 | 10 | 10 | 10 | 10 | 10 |

TABLE 4

| | Component | Comparative Example 7 | Comparative Example 8 | Comparative Example 9 | Comparative Example 10 | Comparative Example 11 | Comparative Example 12 |
|---|---|---|---|---|---|---|---|
| (A) Component | (A-1)*1 | — | — | — | — | — | — |
| | (A-2)*2 | 55 | 55 | 55 | 55 | 55 | 55 |
| (B) Component | (B-1)*3 | — | — | — | — | — | 5 |
| | (B-2)*4 | — | — | — | — | — | — |
| | (B-3)*5 | — | — | — | — | — | — |
| | FA-024M*6 | 5 | — | — | — | — | 5 |
| | TMPT*7 | — | 5 | — | — | — | — |
| | A-TMMT*8 | — | — | 5 | — | — | — |
| | FA-321M*9 | 30 | 30 | 30 | 35 | 30 | 35 |
| | BPE-200*10 | 10 | 10 | 10 | 10 | 15 | — |
| | BPE-100*11 | — | — | — | — | — | — |
| | BPE-80N*12 | — | — | — | — | — | — |
| (C) Component | B-CIM*13 | 2.9 | 2.9 | 2.9 | 2.9 | 2.9 | 2.9 |
| (D) Component | EAB*14 | 0.1 | 0.1 | 0.1 | 0.1 | 0.1 | 0.1 |
| Additive | Leuco crystal violet | 0.3 | 0.3 | 0.3 | 0.3 | 0.3 | 0.3 |
| | Malachite green | 0.05 | 0.05 | 0.05 | 0.05 | 0.05 | 0.05 |
| Organic solvent | Acetone | 10 | 10 | 10 | 10 | 10 | 10 |
| | Toluene | 10 | 10 | 10 | 10 | 10 | 10 |
| | Methanol | 10 | 10 | 10 | 10 | 10 | 10 |

The respective components in Tables 1 to 4 were as follows.

(A) Component: Binder Polymer
*1: (A-1)
Methacrylic acid/methyl methacrylate/benzyl methacrylate=25/5/25/45 (mass ratio)
Weight-average molecular weight=50000
Solid content=50 mass %

*2: (A-2)
Methacrylic acid/methyl methacrylate/phenoxyethyl methacrylate/styrene=25/5/25/45 (mass ratio)
Weight-average molecular weight=50000
Solid content=50 mass %

(B) Component: Photopolymerizable compound
*3: (B-1)
A compound with n=0, and $R^4$ being a methyl group in formula (II) (the (meth)acrylate compound having a skeleton derived from dipentaerythritol)

*4: (B-2)
A compound with n=2, and $R^4$ being hydrogen in formula (II) (the (meth)acrylate compound having a skeleton derived from dipentaerythritol)

*5: (B-3)
A compound with n=4, and $R^4$ being hydrogen in formula (II) (the (meth)acrylate compound having a skeleton derived from dipentaerythritol)

*6: FA-024M (product name, manufactured by Hitachi Chemical Company, Ltd.)
EOPO modified dimethacrylate

*7: TMPT (product name, manufactured by Shin-Nakamura Chemical Co., Ltd.)
Trimethylol propane triacrylate

*8: A-TMMT (product name, manufactured by Shin-Nakamura Chemical Co., Ltd.)
Pentaerythritol tetraacrylate

*9: FA-321M (product name, manufactured by Hitachi Chemical Company, Ltd.)
2,2-bis(4-(methacryloxypentaethoxy)phenyl)propane (the compound represented by the formula (III), with the number of structural units of the oxyethylene group in one molecule (average): 10)

*10: BPE-200 (product name, manufactured by Shin-Nakamura Chemical Co., Ltd.)
2,2-bis(4-(methacryloxydiethoxy)phenyl)propane (the compound represented by the formula (III), with the number of structural units of the oxyethylene group in one molecule (average): 4)

*11: BPE-100 (product name, manufactured by Shin-Nakamura Chemical Co., Ltd.)
2,2-bis(4-(methacryloxyethoxy)phenyl)propane (the compound represented by the formula (III), with the number of structural units of the oxyethylene group in one molecule (average): 2.6)

*12: BPE-80N (product name, manufactured by Shin-Nakamura Chemical Co., Ltd.)

2,2-bis(4-(methacryloxyethoxy)phenyl)propane (the compound represented by the formula (III), with the number of structural units of the oxyethylene group in one molecule (average): 2.3)

(C) Component: Photopolymerization Initiator

*13: B-CIM (product name, manufactured by Hodogaya Chemical Co., Ltd.)

2,2'-bis(2-chlorophenyl)-4,4',5,5'-tetraphenylbisimidazole

Component (D): Sensitizing Dye

*14: EAB (product name, manufactured by Hodogaya Chemical Co., Ltd.)

4,4'-bis(diethylamino)benzophenone

*15: Pyrazoline compound (compound name: 1-phenyl-3-(4-methoxystyryl)-5-(4-methoxyphenyl) pyrazoline, manufactured by NIPPON CHEMICAL INDUSTRIAL CO., LTD.)

<Production of Photosensitive Element>

Each of the photosensitive resin compositions of Examples 1 to 12 and Comparative Examples 1 to 12 obtained above was applied onto a 16-Gm-thick polyethylene terephthalate film (product name "HTF01", manufactured by TEIJIN LIMITED) (support) uniformly, followed by drying in a hot air convection dryer at 100° C. for 10 minutes, to form a photosensitive resin layer having a film thickness of 25 μm after drying. A polypropylene film (product name "NF-15", manufactured by TAMAPOLY CO., LTD.) (protective layer) was bonded onto the photosensitive resin layer, so that a photosensitive element in which the polyethylene terephthalate film (support), the photosensitive resin layer, and the protective layer were laminated in this order was obtained.

<Production of Laminated Product>

Copper surfaces of a copper-clad laminate (as a substrate, product name "MCL-E-67", manufactured by Hitachi Chemical Company, Ltd.), which was a glass epoxy material with 12-μm-thick copper foils laminated on both surfaces, were polished using a polishing machine (manufactured by SANKEI CO., LTD.) provided with a brush corresponding to #600, and were washed with water, followed by airflow drying. The copper-clad laminate after polishing was heated to 80° C., and each of the photosensitive elements obtained above was laminated to the copper-clad laminate so that the photosensitive resin layer was in contact with the copper surface, while the protective layer was peeled off. The lamination was performed using a heat roller at 110° C. by pressure bonding at a pressure of 0.40 MPa and a roller speed of 1.5 m/minute. Thus, a laminated product in which the copper-clad laminate, the photosensitive resin layer, and the support were laminated in this order was obtained for each. The laminated product obtained herein was used as a test piece in the following evaluation.

<Evaluation>

(Photosensitivity Measurement Test)

The test piece obtained above was divided into three regions, and a HITACHI 41-step tablet with a concentration region of 0.00 to 2.00, a concentration step of 0.05, a tablet size of 20 mm×187 mm, and each step size of 3 mm×12 mm was placed on the support in one of the regions, and the photosensitive resin layer was exposed to light with an energy amount (exposure amount) of 100 mJ/cm$^2$ using a projection exposure apparatus (product name "UX-2240SMXJ-01", manufactured by USHIO INC.) with a semiconductor laser at a wavelength of 365 nm as a light source. At this time, other regions that were not used were covered by a black sheet. Further, the other regions were individually exposed to light, respectively, with energy amounts of 150 mJ/cm$^2$ and 200 mJ/cm$^2$ in the same manner.

Next, the support was peeled off from the test piece, and development was performed, using a 1.0 mass % sodium carbonate aqueous solution at 30° C., by taking the time when the unexposed portions were completely removed as the minimum development time, setting the time twice the minimum development time as a development time, developing the photosensitive resin layer by spraying, and removing the unexposed portions. After the development, the number of remaining steps in the step tablet of the photo-cured product formed on the copper-clad laminate with each exposure amount was counted.

Subsequently, a standard curve of the exposure amount and the number of remaining steps was plotted, and the energy amount (mJ/cm$^2$) with which the number of remaining steps after the development was 14.0 was determined as the photosensitivity of the photosensitive resin composition. A lower energy amount (mJ/cm$^2$) indicates a higher photosensitivity. The results are shown in Tables 5 to 8. It should be noted that there is no problem in use when the photosensitivity is 150 mJ/cm$^2$ or less.

(Evaluation of Adhesion)

A glass mask having a wiring pattern with line width/space width of y/3y (y=1 to 30) (unit: μm) as a pattern for evaluating the adhesion was placed on the support of the test piece obtained above, and the photosensitive resin layer was exposed to light with the energy amount with which the number of remaining steps of a HITACHI 41-step tablet after the development was 14.0 using a projection exposure apparatus (product name "UX-2240SMXJ-01", manufactured by USHIO INC.) with a semiconductor laser at a wavelength of 365 nm as a light source. After the exposure, development was performed in the same manner as in the above measurement test for the photosensitivity.

After the development, resist patterns were observed using an optical microscope. Of the resist patterns in which the space portions (unexposed portions) were completely removed, and the line portions (exposed portions) were formed without meandering or chipping, the minimum width of the line portions (minimum line width, unit: μm) was used as an index for evaluating the adhesion. A lower numerical value of this index indicates a better adhesion. The results are shown in Tables 5 to 8.

(Evaluation of Resolution)

A glass mask having a wiring pattern with line width/space width of z/z (z=1 to 30) (unit: μm) as a pattern for evaluating the resolution was placed on the support of the test piece obtained above, and the photosensitive resin layer was exposed to light with the energy amount with which the number of remaining steps of a HITACHI 41-step tablet after the development was 14.0 using a projection exposure apparatus (product name "UX-2240SMXJ-01", manufactured by USHIO INC.) with a semiconductor laser at a wavelength of 365 nm as a light source. After the exposure, development was performed in the same manner as in the above measurement test for the photosensitivity.

After the development, resist patterns were observed using an optical microscope. Of the resist patterns in which the space portions (unexposed portions) were completely removed, and the line portions (exposed portions) were formed without meandering or chipping, the minimum space width between line portions (minimum space width, unit: μm) was used as an index for evaluating the resolution. A lower numerical value of this index indicates a better resolution. The results are shown in Tables 5 to 8.

(Evaluation of Resist Footing)

The resist footing was evaluated by observing line portions with a line width of 10 μm in the resist patterns formed for evaluating the adhesion. Using a scanning electron microscope (SEM) (product name "SU-1500", manufactured by Hitachi High-Technologies Corporation), the resist shape was observed at an acceleration voltage of 15 kV, a magnification of 3000 times, and a tilt angle of 60 degrees, and the resist footing was evaluated according to the following criteria. That is, the footing was evaluated as "A" when the maximum length of the footing occurring from the resist side and the resist bottom was 0 μm or more and less than 0.5 μm, and was evaluated as "B" when the maximum length was 0.5 μm or more. Further, the footing was evaluated as "C" when an undercut was observed at the resist bottom. The evaluation results are shown in Tables 5 to 8.

TABLE 5

| Evaluation item | Example 1 | Example 2 | Example 3 | Example 4 | Example 5 | Example 6 |
|---|---|---|---|---|---|---|
| Photosensitivity (mJ/cm$^2$) | 120 | 120 | 120 | 120 | 120 | 150 |
| Adhesion (μm) | 8 | 8 | 8 | 8 | 8 | 8 |
| Resolution (μm) | 9 | 8 | 8 | 8 | 8 | 8 |
| Resist footing | A | A | A | A | A | A |

TABLE 6

| Evaluation item | Comparative Example 1 | Comparative Example 2 | Comparative Example 3 | Comparative Example 4 | Comparative Example 5 | Comparative Example 6 |
|---|---|---|---|---|---|---|
| Photosensitivity (mJ/cm$^2$) | 120 | 120 | 120 | 120 | 120 | 120 |
| Adhesion (μm) | 10 | 7 | 7 | 12 | 10 | 12 |
| Resolution (μm) | 10 | 8 | 8 | 10 | 8 | 10 |
| Resist footing | B | B | B | C | B | B |

Comparison of Examples 1 to 6 with Comparative Examples 1 to 3

As shown in Tables 5 and 6, the photosensitive elements produced from the photosensitive resin compositions for projection exposure of Examples 1 to 6 showed properties allowing formation of resist patterns that were excellent in adhesion, resolution, and inhibitory properties against the occurrence of resist footing, as compared with Comparative Example 1. In particular, Comparative Example 1 used a bifunctional (meth)acrylate compound as the (B) component but did not use the (meth)acrylate compound having a skeleton derived from dipentaerythritol, which resulted in not only poor adhesion and poor resolution but also poor inhibitory properties against the occurrence of resist footing of the resist pattern to be formed, as compared with Examples 1 to 6.

Likewise, Comparative Examples 2 and 3 used a trifunctional or higher (meth)acrylate compound as the (B) component but did not use the (meth)acrylate compound having a skeleton derived from dipentaerythritol, which resulted in poor inhibitory properties against the occurrence of resist footing of the resist patterns to be formed, as compared with Examples 1 to 6.

Figure 3:
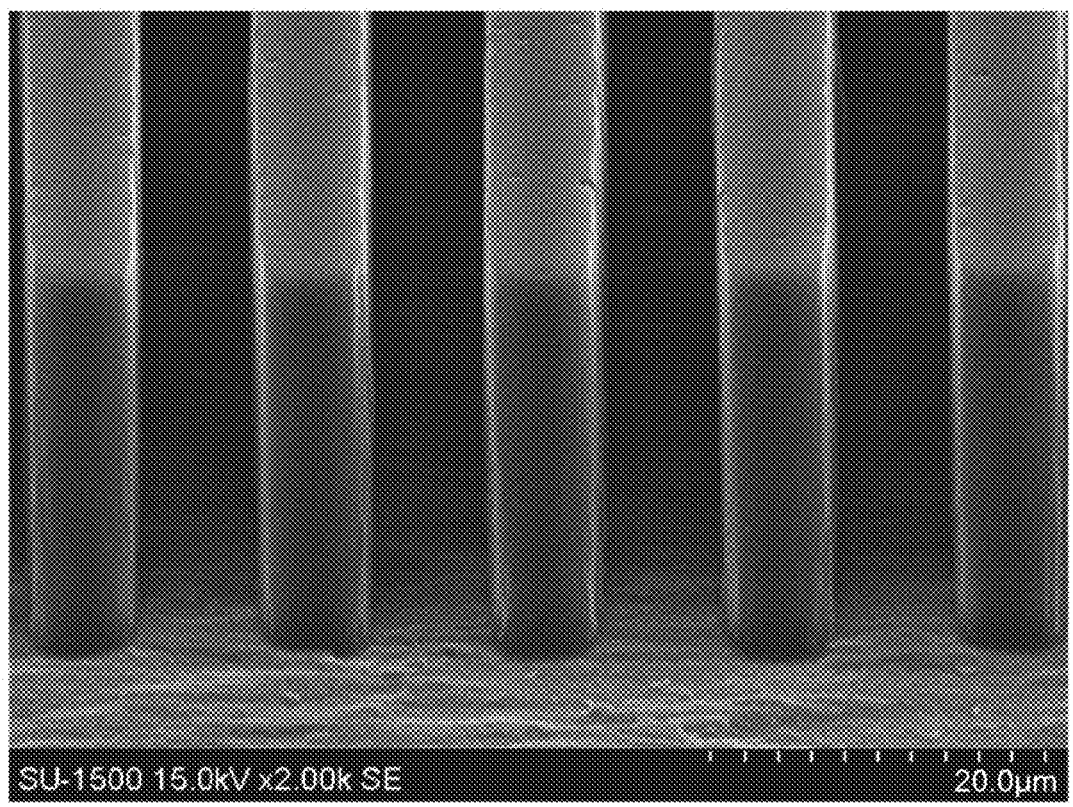
FIG. 3 is a scanning electron microscope (SEM) image of a resist pattern formed in Example 2.
Figure 4:
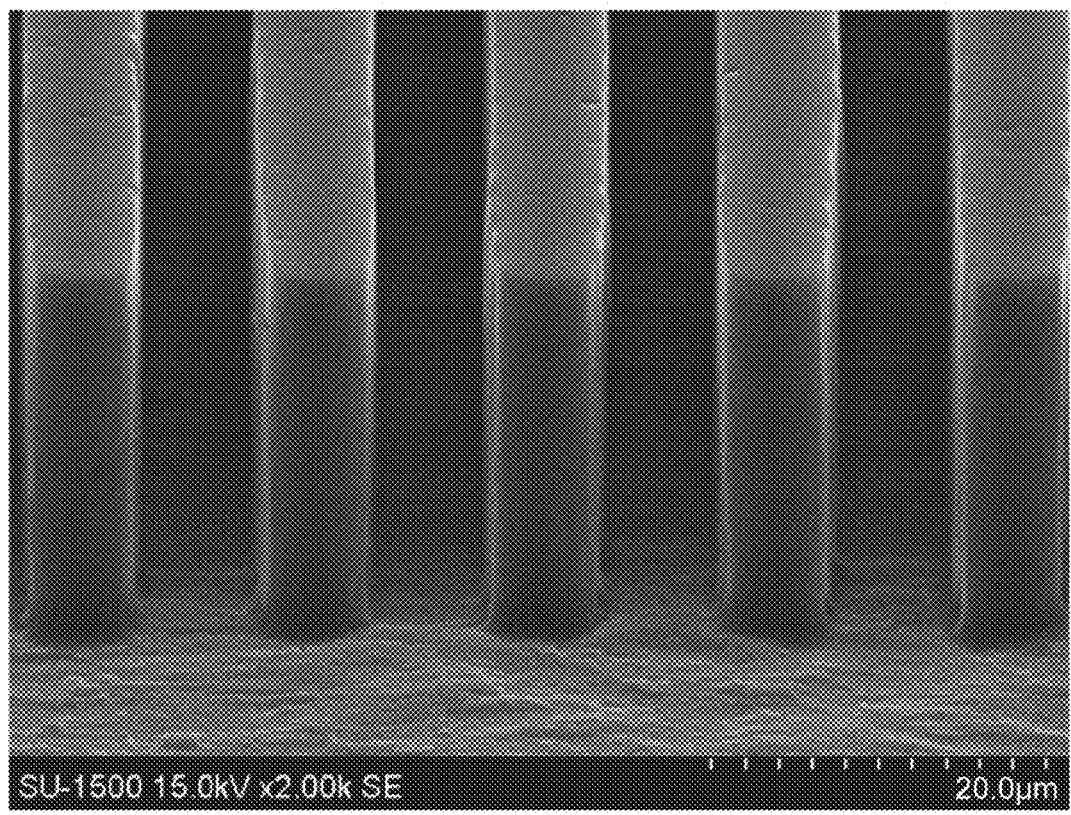
FIG. 4 is a scanning electron microscope (SEM) image of a resist pattern formed in Comparative Example 1.
Figure 5:
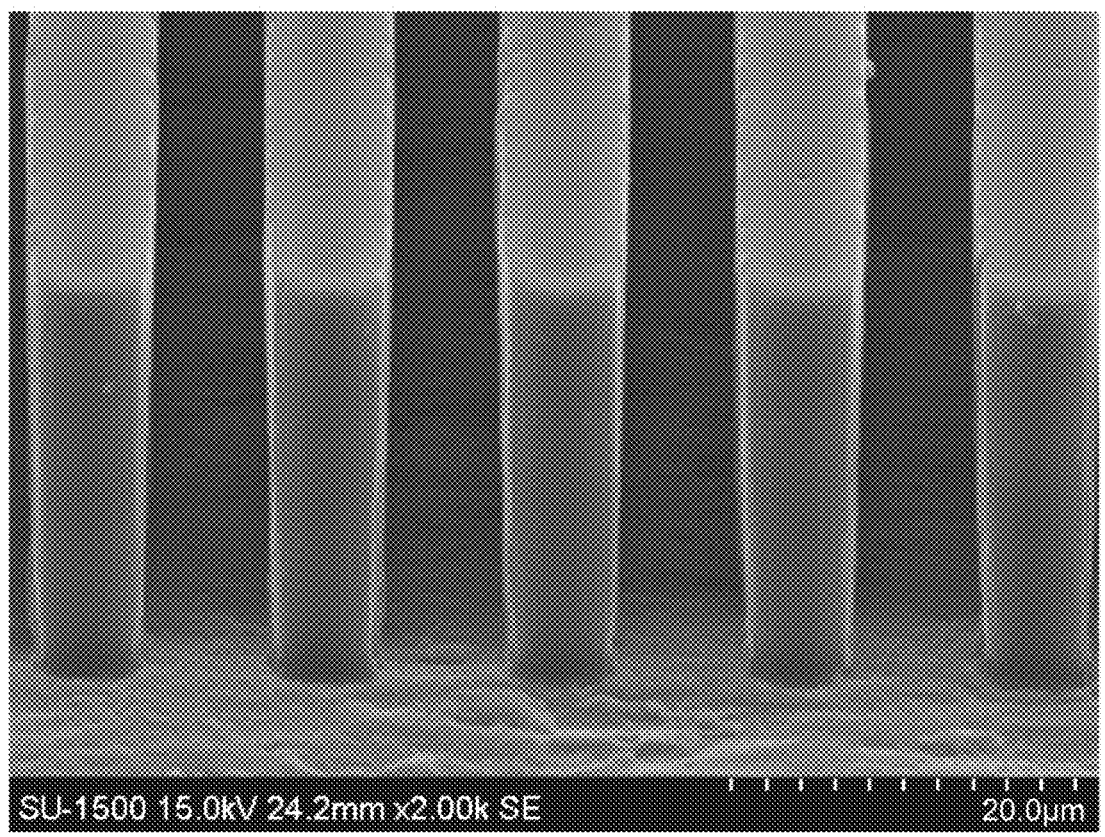
FIG. 5 is a scanning electron microscope (SEM) image of a resist pattern formed in Comparative Example 2.

Further, the scanning electron microscope (SEM) images of the resist patterns formed in Example 2 and Comparative Examples 1 and 2 are shown respectively in FIGS. 3 to 5. It is seen from FIGS. 3 to 5 that, whereas resist footing with a length of 0.5 μm or more occurred in the resist patterns (FIG. 4 and FIG. 5) formed in Comparative Examples 1 and 2, little resist footing occurred in the resist pattern (FIG. 3) formed in Example 2.

It was confirmed from the above results that the photosensitive resin compositions of Examples 1 to 6 can form resist patterns that are excellent in adhesion, resolution, and inhibitory properties against the occurrence of resist footing in the projection exposure method.

Comparison of Examples 1 to 6 with Comparative Examples 4 to 6

As shown in Tables 5 and 6, the photosensitive elements produced from the photosensitive resin compositions for projection exposure of Examples 1 to 6 showed properties allowing formation of resist patterns that were excellent in adhesion, resolution, and inhibitory properties against the occurrence of resist footing, as compared with Comparative Examples 4 and 5. From these results, it has been revealed that the adhesion, the resolution, and the inhibitory properties against the occurrence of resist footing of resist patterns cannot be improved only by increasing the addition amount of the photopolymerizable compounds having a comparatively high hydrophobic action (FA-321M and BPE-200) as in Comparative Examples 4 and 5.

Further, Comparative Example 6 did not use the compound represented by the formula (III), which resulted in poor adhesion, poor resolution, and poor inhibitory properties against the occurrence of resist footing of the resist pattern to be formed, as compared with Examples 1 to 6. From these results, it has been revealed that the adhesion, the resolution, and the inhibitory properties against the occurrence of resist footing of resist patterns cannot be improved without addition of the compound represented by the formula (III) (BPE-200, BPE-100, and BPE-80N) out of photopolymerizable compounds having a hydrophobic action.

TABLE 7

| Evaluation item | Example 7 | Example 8 | Example 9 | Example 10 | Example 11 | Example 12 |
|---|---|---|---|---|---|---|
| Photosensitivity (mJ/cm$^2$) | 120 | 120 | 120 | 120 | 120 | 150 |
| Adhesion (μm) | 8 | 8 | 8 | 8 | 8 | 8 |
| Resolution (μm) | 9 | 8 | 8 | 8 | 8 | 8 |
| Resist footing | A | A | A | A | A | A |

TABLE 8

| Evaluation item | Comparative Example 7 | Comparative Example 8 | Comparative Example 9 | Comparative Example 10 | Comparative Example 11 | Comparative Example 12 |
|---|---|---|---|---|---|---|
| Photosensitivity (mJ/cm$^2$) | 120 | 120 | 120 | 120 | 120 | 120 |
| Adhesion (μm) | 10 | 7 | 7 | 12 | 10 | 12 |
| Resolution (μm) | 10 | 8 | 8 | 10 | 8 | 10 |
| Resist footing | B | B | B | C | B | B |

Comparison of Examples 7 to 12 with Comparative Examples 7 to 9

As shown in Tables 7 and 8, the photosensitive elements produced from the photosensitive resin compositions for projection exposure of Examples 7 to 12 showed properties allowing formation of resist patterns that were excellent in adhesion, resolution, and inhibitory properties against the occurrence of resist footing, as compared with Comparative Example 7. In particular, Comparative Example 7 used a bifunctional (meth)acrylate compound as the (B) component but did not use the (meth)acrylate compound having a skeleton derived from dipentaerythritol, which resulted in not only poor adhesion and poor resolution but also poor inhibitory properties against the occurrence of resist footing of the resist pattern to be formed, as compared with Examples 7 to 12.

Likewise, Comparative Examples 8 and 9 used a trifunctional or higher (meth)acrylate compound as the (B) component but did not use the (meth)acrylate compound having a skeleton derived from dipentaerythritol, which resulted in poor inhibitory properties against the occurrence of resist footing of the resist patterns to be formed, as compared with Examples 7 to 12.

It was confirmed from the above results that the photosensitive resin compositions of Examples 7 to 12 can form resist patterns that are excellent in adhesion, resolution, and inhibitory properties against the occurrence of resist footing in the projection exposure method.

Comparison of Examples 7 to 12 with Comparative Examples 10 to 12

As shown in Tables 7 and 8, the photosensitive elements produced from the photosensitive resin compositions for projection exposure of Examples 7 to 12 showed properties allowing formation of resist patterns that were excellent in adhesion, resolution, and inhibitory properties against the occurrence of resist footing, as compared with Comparative Examples 10 and 11. From these results, it has been revealed that the adhesion, the resolution, and the inhibitory properties against the occurrence of resist footing of resist patterns cannot be improved only by increasing the addition amount of the photopolymerizable compounds having a comparatively high hydrophobic action (FA-321M and BPE-200) as in Comparative Examples 10 and 11.

Further, Comparative Example 12 did not use the compound represented by the formula (III), which resulted in poor adhesion, poor resolution, and poor inhibitory properties against the occurrence of resist footing of the resist pattern to be formed, as compared with Examples 7 to 12. From these results, it has been revealed that the adhesion, the resolution, and the inhibitory properties against the occurrence of resist footing of resist patterns cannot be improved without addition of the compound represented by the formula (III) (BPE-200, BPE-100, and BPE-80N) out of the photopolymerizable compounds having a hydrophobic action.

INDUSTRIAL APPLICABILITY

As described above, the present invention can provide a photosensitive resin composition for projection exposure capable of forming a resist pattern that is excellent in adhesion, resolution, and inhibitory properties against the occurrence of resist footing in the projection exposure method, a photosensitive element a method for forming a resist pattern, a process for producing a printed wiring board, and a process for producing a lead frame using this composition.

REFERENCE SIGNS LIST

1 . . . Photosensitive element, 2 . . . Support, 3, 32 . . . Photosensitive resin layer for projection exposure, 4 . . . Protective layer, 10 . . . Conductor layer, 15 . . . Insulating layer, 30 . . . Resist pattern, 40 . . . Circuit pattern, 42 . . . Plating layer, 50 . . . Active light.

The invention claimed is:
1. A photosensitive resin composition for projection exposure, comprising:
(A) a binder polymer;
(B) a photopolymerizable compound having an ethylenically unsaturated bond;
(C) a photopolymerization initiator; and
(D) a sensitizing dye not including a pyrazoline, wherein the (B) photopolymerizable compound having an ethylenically unsaturated bond comprises a (meth)acrylate compound having a skeleton derived from dipentaerythritol and a compound represented by the following formula (III):

[Chemical Formula 1]

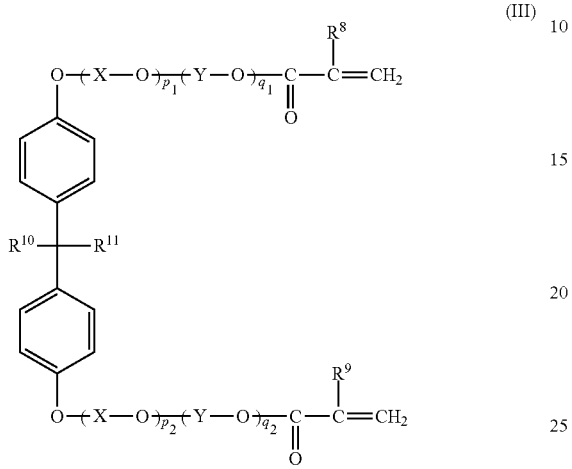

wherein $R^8$, $R^9$, $R^{10}$, and $R^{11}$ each independently represent a hydrogen atom or a methyl group, X and Y each independently represent an ethylene group or a propylene group, $p_1$, $p_2$, $q_1$, and $q_2$ each independently represent a numerical value of 0 to 9, both $p_1+q_1$ and $p_2+q_2$ are 1 or more, and $p_1+q_1+p_2+q_2$ is 2 to 9.

2. The photosensitive resin composition for projection exposure according to claim 1, wherein the (meth)acrylate compound having a skeleton derived from dipentaerythritol has an ethylene oxide chain.

3. A method for forming a resist pattern, comprising:
a photosensitive resin layer forming step of forming a photosensitive resin layer on a substrate using the photosensitive resin composition for projection exposure according to claim 1;
an exposure step of exposing at least a part of the photosensitive resin layer to active light projecting an image of a photomask via a lens to photocure an exposed portion; and
a development step of removing an uncured portion of the photosensitive resin layer from the substrate by development.

4. A photosensitive element comprising:
a support; and
a photosensitive resin layer formed on the support using the photosensitive resin composition for projection exposure according to claim 1.

5. A process for producing a printed wiring board, comprising:
a step of forming a resist pattern on a substrate including a conductor layer by the method for forming a resist pattern according to claim 3; and
a step of forming a conductor pattern by etching portions of the conductor layer not covered by photosensitive resin of the resist pattern or by plating portions of the conductor layer not covered by photosensitive resin of the resist pattern.

6. A process for producing a lead frame, comprising:
a step of forming a resist pattern on a substrate including a conductor layer by the method for forming a resist pattern according to claim 3; and
a step of forming a conductor pattern by plating portions of the conductor layer not covered by photosensitive resin of the resist pattern.

7. A method for forming a resist pattern, comprising:
a photosensitive resin layer forming step of forming a photosensitive resin layer on a substrate using the photosensitive resin composition for projection exposure according to claim 2; an exposure step of exposing at least a part of the photosensitive resin layer to active light projecting an image of a photomask via a lens to photocure an exposed portion; and
a development step of removing an uncured portion of the photosensitive resin layer from the substrate by development.

8. A photosensitive element comprising:
a support; and
a photosensitive resin layer formed on the support using the photosensitive resin composition for projection exposure according to claim 2.

9. A process for producing a printed wiring board, comprising:
a step of forming a resist pattern on a substrate including a conductor layer by the method for forming a resist pattern according to claim 7; and
a step of forming a conductor pattern by etching portions of the conductor layer not covered by photosensitive resin of the resist pattern or plating portions of the conductor layer not covered by photosensitive resin of the resist pattern.

10. A process for producing a lead frame, comprising:
a step of forming a resist pattern on a substrate including a conductor layer by the method for forming a resist pattern according to claim 7; and
a step of forming a conductor pattern by plating portions of the conductor layer not covered by photosensitive resin of the resist pattern.

11. A process for producing a printed wiring board, comprising:
a step of forming a resist pattern on a substrate including a conductor layer by the method for forming a resist pattern according to claim 7; and
a step of forming a conductor pattern by etching portions of the conductor layer not covered by photosensitive resin of the resist pattern.

12. A process for producing a printed wiring board, comprising:
a step of forming a resist pattern on a substrate including a conductor layer by the method for forming a resist pattern according to claim 3; and
a step of forming a conductor pattern by etching portions of the conductor layer not covered by photosensitive resin of the resist pattern.

13. A process for producing a printed wiring board, comprising:
a step of forming a resist pattern on a substrate including a conductor layer by the method for forming a resist pattern according to claim 3; and
a step of forming a conductor pattern by plating portions of the conductor layer not covered by photosensitive resin of the resist pattern, then removing the resist pattern and etching the conductor layer that had been covered by the resist pattern.

14. A process for producing a printed wiring board, comprising:

a step of forming a resist pattern on a substrate including a conductor layer by the method for forming a resist pattern according to claim 7; and a step of forming a conductor pattern by plating portions of the conductor layer not covered by photosensitive resin of the resist pattern, then removing the resist pattern and etching the conductor layer that had been covered by the resist pattern.

15. A process for producing a lead frame, comprising:

a step of forming a resist pattern on a substrate including a conductor layer by the method for forming a resist pattern according to claim 3; and a step of forming a conductor pattern by plating portions of the conductor layer not covered by photosensitive resin of the resist pattern, then removing the resist pattern and etching the conductor layer that had been covered by the resist pattern.

16. A process for producing a lead frame, comprising:

a step of forming a resist pattern on a substrate including a conductor layer by the method for forming a resist pattern according to claim 7; and a step of forming a conductor pattern by plating portions of the conductor layer not covered by photosensitive resin of the resist pattern, then removing the resist pattern and etching the conductor layer that had been covered by the resist pattern.

* * * * *